(12) United States Patent
Nakagawa et al.

(10) Patent No.: US 12,149,163 B2
(45) Date of Patent: Nov. 19, 2024

(54) POWER CONVERSION DEVICE WITH VOLTAGE ABNORMALITY CONTROL

(71) Applicant: Mitsubishi Electric Corporation, Tokyo (JP)

(72) Inventors: Kado Nakagawa, Tokyo (JP); Jino Yoon, Tokyo (JP); Nobuhiro Kihara, Tokyo (JP); Mai Nakada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 279 days.

(21) Appl. No.: 17/716,210

(22) Filed: Apr. 8, 2022

(65) Prior Publication Data

US 2023/0129370 A1 Apr. 27, 2023

(30) Foreign Application Priority Data

Oct. 26, 2021 (JP) ................................ 2021-174483

(51) Int. Cl.
*H02M 1/32* (2007.01)
*G01R 31/28* (2006.01)
*H02M 3/158* (2006.01)

(52) U.S. Cl.
CPC .......... *H02M 1/32* (2013.01); *G01R 31/2829* (2013.01); *H02M 3/158* (2013.01)

(58) Field of Classification Search
CPC .... H02M 1/32; H02M 1/325; G01R 31/3835; G01R 31/2829
See application file for complete search history.

(56) References Cited

U.S. PATENT DOCUMENTS

| | | | | |
|---|---|---|---|---|
| 2007/0120530 A1* | 5/2007 | Nozaki | ............... | H02J 7/00308 320/130 |
| 2007/0223259 A1* | 9/2007 | Nozaki | ................. | B60L 3/0038 363/50 |
| 2013/0119961 A1* | 5/2013 | Okuda | ................ | H02M 7/4837 323/299 |
| 2015/0263624 A1* | 9/2015 | Nobe | ...................... | H02M 1/32 323/299 |
| 2017/0279356 A1* | 9/2017 | Kihara | ...................... | H02P 1/18 |

(Continued)

FOREIGN PATENT DOCUMENTS

| | | | | |
|---|---|---|---|---|
| JP | 2004088866 A | * | 3/2004 | ............ H02M 3/155 |
| JP | 4225122 B2 | | 2/2009 | |

*Primary Examiner* — Gustavo A Rosario-Benitez
(74) *Attorney, Agent, or Firm* — Sughrue Mion, PLLC; Richard C. Turner

(57) ABSTRACT

Provided is a technology in which a control device of a converter performs gate cutoff for cutting off power supply to a load when one of a battery detection value obtained by a battery voltage sensor or a low-voltage-side detection value obtained by a low-voltage-side voltage sensor or both thereof are abnormal values. After the control device performs the gate cutoff, the control device determines whether or not a main body circuitry is abnormal based on the battery detection value and the low-voltage-side detection value. When the control device determines that the main body circuitry is not abnormal, the control device determines whether one of the battery voltage sensor or the low-voltage-side voltage sensor is abnormal based on the battery detection value, the low-voltage-side detection value, and a high-voltage-side detection value obtained by a high-voltage-side voltage sensor.

18 Claims, 10 Drawing Sheets

(56) References Cited

U.S. PATENT DOCUMENTS

| | | | |
|---|---|---|---|
| 2019/0305681 A1* | 10/2019 | Fujii | G01R 31/40 |
| 2020/0153333 A1* | 5/2020 | Maeda | H02M 1/32 |
| 2020/0195146 A1* | 6/2020 | Kihara | H02M 3/155 |
| 2021/0184557 A1* | 6/2021 | Nishibata | H02M 1/32 |
| 2022/0393504 A1* | 12/2022 | Nishibata | H02M 7/53871 |

* cited by examiner

POWER CONVERSION DEVICE WITH VOLTAGE ABNORMALITY CONTROL

BACKGROUND OF THE INVENTION

1. Field of the Invention

This disclosure relates to a power conversion device.

2. Description of the Related Art

In an abnormality monitoring device of a power conversion device which has hitherto been adopted, a deviation between a battery voltage and an input-side voltage of the power conversion device is calculated during a step-up operation of the power conversion device. When the deviation is equal to or larger than a reference value, a voltage sensor in an abnormal state is identified based on the battery voltage, the input-side voltage of the power conversion device, and an output-side voltage of the power conversion device (see, for example, Japanese Patent No. 4225122).

In the abnormality monitoring device which has hitherto been adopted, when a voltage abnormality is detected, abnormality determination of the voltage sensor is performed while power is continuously supplied to a load. Therefore, when a voltage abnormality has actually occurred in a main body circuitry of the power conversion device, there is a fear in that an overvoltage may occur to cause damage to a component.

SUMMARY OF THE INVENTION

This disclosure has been made to solve the above-mentioned problem, and has an object to obtain a power conversion device capable of performing abnormality determination of a voltage sensor while preventing damage from being caused to each component due to a voltage abnormality.

According to at least one embodiment of this disclosure, there is provided a power conversion device including: a main body circuitry which is connected to a battery and a load, and which is configured to convert a voltage; a low-voltage-side voltage sensor configured to detect a voltage on a low-voltage side of the main body circuitry; a high-voltage-side voltage sensor configured to detect a voltage on a high-voltage side of the main body circuitry; and a control device configured to control the main body circuitry, and to acquire: a low-voltage-side detection value being a detection value obtained by the low-voltage-side voltage sensor; a high-voltage-side detection value being a detection value obtained by the high-voltage-side voltage sensor; and a battery detection value being a detection value obtained by a battery voltage sensor configured to detect a voltage of the battery. In the power conversion device, the control device is configured to: control, when one of the battery detection value or the low-voltage-side detection value or both thereof are abnormal values, the main body circuitry to perform gate cutoff for cutting off power supply to the load; perform, after the control device performs the gate cutoff, a first determination processing step of determining whether the main body circuitry is abnormal based on the battery detection value and the low-voltage-side detection value; and perform, when the control device determines in the first determination processing step that the main body circuitry is not abnormal, a second determination processing step of determining whether one of the battery voltage sensor or the low-voltage-side voltage sensor is abnormal based on the battery detection value, the low-voltage-side detection value, and the high-voltage-side detection value.

According to the power conversion device of the at least one embodiment of this disclosure, it is possible to perform the abnormality determination of the voltage sensor while preventing damage from being caused to each component due to the voltage abnormality.

DESCRIPTION OF THE EMBODIMENTS

Now, embodiments of this disclosure are described with reference to the drawings. In the following description, like components are denoted by like reference symbols.

First Embodiment

Figure 1:
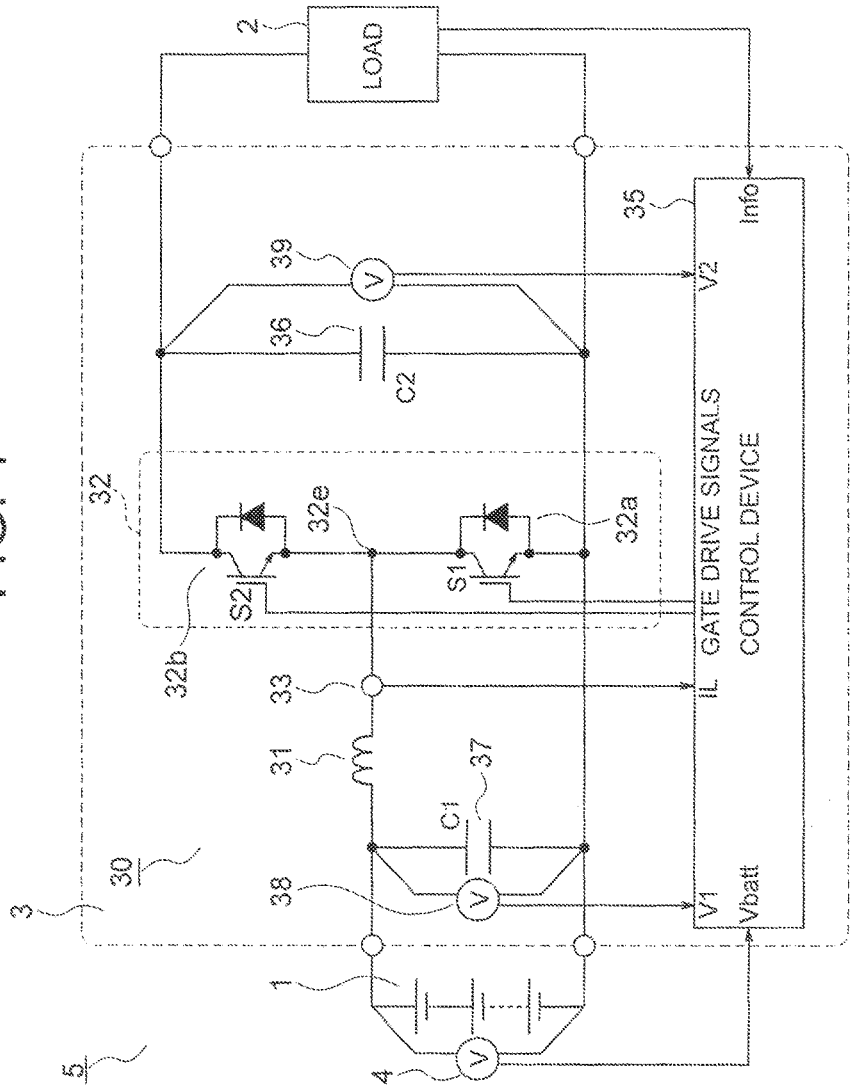
FIG. 1 is a diagram for illustrating a configuration of a power propagation system in a first embodiment of this disclosure.

FIG. 1 is a diagram for illustrating a configuration of a power propagation system in a first embodiment of this disclosure. A power propagation system 5 illustrated in FIG. 1 includes one or more batteries 1, a load 2, a converter 3, and a battery voltage sensor 4. The power propagation system 5 is a system for supplying power from the battery 1 to the load 2 through the converter 3. The power propagation system 5 may also be a system for causing the battery 1 to accumulate power generated by the load 2 through the converter 3. The power propagation system 5 is applied to, for example, a hybrid vehicle.

<Converter>

The converter 3 is a power conversion device capable of bidirectional voltage conversion between a low-voltage side and a high-voltage side. The converter 3 uses a low-voltage-side voltage as an input-side voltage to boost a voltage.

Then, the converter 3 outputs a high-voltage-side voltage subjected to the boosting as an output-side voltage.

The low-voltage side of the converter 3 is connected to the battery 1. As the battery 1, a capacitor may be used. Meanwhile, the high-voltage side of the converter 3 is connected to the load 2.

In addition, the converter 3 includes a main body circuitry 30, a current sensor 33, a low-voltage-side voltage sensor 38, a high-voltage-side voltage sensor 39, and a control device 35.

The main body circuitry 30 includes a reactor 31, a power conversion circuit 32, a low-voltage-side capacitor 37, and a high-voltage-side capacitor 36. The main body circuitry 30 is connected to the battery 1 and the load 2. The main body circuitry 30 boosts the voltage applied from the battery 1 to supply power to the load 2. Thus, the converter 3 drives the load 2.

<Power Conversion Circuit>

The power conversion circuit 32 boosts the low-voltage-side voltage being an input-side voltage to the high-voltage-side voltage being an output-side voltage. The power conversion circuit 32 includes a positive-electrode-side switching element 32b and a negative-electrode-side switching element 32a. The positive-electrode-side switching element 32b and the negative-electrode-side switching element 32a are connected in series to each other. The positive-electrode-side switching element 32b and the negative-electrode-side switching element 32a form a switching circuit in the converter 3.

A parallel connection unit may be used in place of at least one of the negative-electrode-side switching element 32a or the positive-electrode-side switching element 32b. The parallel connection unit is a unit in which a plurality of switching elements are connected in parallel.

The negative-electrode-side switching element 32a and the positive-electrode-side switching element 32b are controlled by the control device 35. An insulated gate bipolar transistor (IGBT) is used as each of the negative-electrode-side switching element 32a and the positive-electrode-side switching element 32b. The IGBT is configured such that a free wheel diode is connected in antiparallel thereto.

A field effect transistor (FET) may be used as each of the negative-electrode-side switching element 32a and the positive-electrode-side switching element 32b. The FET includes a parasitic diode connected in antiparallel thereto.

In another case, bipolar transistors may be used as the negative-electrode-side switching element 32a and the positive-electrode-side switching element 32b. The bipolar transistor includes a diode connected in antiparallel thereto.

The control device 35 outputs a first gate drive signal S1 and a second gate drive signal S2. The negative-electrode-side switching element 32a is turned on when the first gate drive signal S1 is at a high level. The negative-electrode-side switching element 32a is turned off when the first gate drive signal S1 is at a low level. Meanwhile, the positive-electrode-side switching element 32b is turned on when the second gate drive signal S2 is at a high level. The positive-electrode-side switching element 32b is turned off when the second gate drive signal S2 is at a low level.

One end of the negative-electrode-side switching element 32a is connected to a negative-electrode-side terminal of the low-voltage-side capacitor 37 through a wiring on a negative electrode side. Meanwhile, the other end of the negative-electrode-side switching element 32a is connected to a positive-electrode-side terminal of the low-voltage-side capacitor 37 through a first connection point 32e and the reactor 31.

One end of the positive-electrode-side switching element 32b is connected to the other end of the negative-electrode-side switching element 32a through the first connection point 32e. The other end of the positive-electrode-side switching element 32b is connected to a positive-electrode-side terminal of the high-voltage-side capacitor 36. A negative-electrode-side terminal of the high-voltage-side capacitor 36 is connected to the one end of the negative-electrode-side switching element 32a through a wiring on a negative electrode side.

<Capacitor and Reactor>

The low-voltage-side capacitor 37 smooths the low-voltage-side voltage being an input-side voltage of the converter 3. The high-voltage-side capacitor 36 smooths the high-voltage-side voltage of the converter 3. The reactor 31 generates energy to be accumulated in the high-voltage-side capacitor 36.

The function of the converter 3 is established even without the low-voltage-side capacitor 37 and the high-voltage-side capacitor 36.

<Load>

In the first embodiment, a rotating machine is used as the load 2. The load 2 being a rotating machine is an electric motor caused to rotate by being supplied with power from the converter 3. The load 2 may be a power generator.

The load 2 is provided with an inverter (not shown). The inverter is electrically connected to the converter 3. The inverter controls output from the converter 3. The load 2 is driven by being supplied with DC power from the converter 3.

Meanwhile, assuming that the load 2 is a power generator, AC power generated by the load 2 is converted into DC power by the inverter. Then, the DC power obtained by the inverter through the conversion is supplied to the battery 1 through the converter 3.

In this case, the inverter serves as a DC/AC converter for converting power between the DC power and the AC power. In addition, the inverter includes a three-phase inverter circuit. The three-phase inverter circuit is a semiconductor switch connected between a positive electrode side connected to a high-voltage-side positive electrode terminal of the converter 3 and a negative electrode side connected to a high-voltage-side negative electrode terminal of the converter 3.

A positive-electrode-side terminal of a three-phase bridge circuit in the inverter is connected to the high-voltage-side positive electrode terminal of the converter 3. A negative-electrode-side terminal of the three-phase bridge circuit is connected to the high-voltage-side negative electrode terminal of the converter 3. A U-phase arm, a V-phase arm, and a W-phase arm are connected in parallel between the positive-electrode-side terminal and the negative-electrode-side terminal.

The U-phase arm is configured such that a U-phase upper arm semiconductor switching element and a U-phase lower arm semiconductor switching element are connected in series. The V-phase arm is configured such that a V-phase upper arm semiconductor switching element and a V-phase lower arm semiconductor switching element are connected in series. The W-phase arm is configured such that a W-phase upper arm semiconductor switching element and a W-phase lower arm semiconductor switching element are connected in series.

The U-phase output terminal is led from a portion at which the U-phase upper arm semiconductor switching element and the U-phase lower arm semiconductor switching element are connected in series. Further, the U-phase output terminal is connected to a U-phase armature winding terminal of the load 2.

The V-phase output terminal is led from a portion at which the V-phase upper arm semiconductor switching element and the V-phase lower arm semiconductor switching element are connected in series. Further, the V-phase output terminal is connected to a V-phase armature winding terminal of the load 2.

The W-phase output terminal is led from a portion at which the W-phase upper arm semiconductor switching element and the W-phase lower arm semiconductor switching element are connected in series. Further, the W-phase output terminal is connected to a W-phase armature winding terminal of the load 2.

Semiconductor chips, for example, IGBTs and FETs, are used as the U-phase upper arm semiconductor switching element and the U-phase lower arm semiconductor switching element. In the same manner, semiconductor chips, for example, IGBTs and FETs, are used as the V-phase upper arm semiconductor switching element and the V-phase lower arm semiconductor switching element. In the same manner, semiconductor chips, for example, IGBTs and FETs, are used as the W-phase upper arm semiconductor switching element and the W-phase lower arm semiconductor switching element.

Only one load 2 is illustrated in FIG. 1, but a system including two or more loads 2 may be used. In this case, a part of the loads 2 may be drive systems, for example, electric motors. Another part of the loads 2 may be power generators.

<Sensor>

The high-voltage-side voltage sensor 39 detects a voltage on the high-voltage side of the main body circuitry 30. The voltage on the high-voltage side is a voltage between the positive electrode and the negative electrode of the high-voltage-side capacitor 36. The low-voltage-side voltage sensor 38 detects a voltage on the low-voltage side of the main body circuitry 30. The voltage on the low-voltage side is a voltage between the positive electrode and the negative electrode of the low-voltage-side capacitor 37.

The current sensor 33 detects a current flowing through the reactor 31. Meanwhile, an output voltage of the battery 1 is detected by the battery voltage sensor 4.

<Control Device>

The control device 35 controls the power conversion circuit 32. Through the control of the power conversion circuit 32, the control device 35 controls the main body circuitry 30.

In addition, the control device 35 acquires a high-voltage-side detection value V2 from the high-voltage-side voltage sensor 39. The control device 35 acquires a detection value IL from the current sensor 33. The control device 35 acquires a low-voltage-side detection value V1 from the low-voltage-side voltage sensor 38. The control device 35 acquires a battery detection value Vbatt from the battery voltage sensor 4.

In addition, the control device 35 acquires an information value Info from the load 2. The information value Info includes, for example, the rotation number, torque, and voltage value of the load 2.

In the first embodiment, the control device 35 compares the high-voltage-side detection value V2 detected by the high-voltage-side voltage sensor 39 and a voltage of the load 2 which is included in the information value Info to each other. The control device 35 calculates the absolute value of a difference between the high-voltage-side detection value V2 and the voltage of the load 2. When the absolute value of the difference is smaller than a determination threshold value, the control device 35 determines that the high-voltage-side voltage sensor 39 is normal. The determination threshold value may be determined experimentally. When the high-voltage-side voltage sensor 39 is normal, the high-voltage-side detection value V2 detected by the high-voltage-side voltage sensor 39 is determined to be a reliable value.

Meanwhile, when the absolute value of the difference between the high-voltage-side detection value V2 and the voltage of the load 2 is equal to or larger than the determination threshold value, it is notified to the outside that a failure has occurred in the high-voltage-side voltage sensor 39.

The converter 3 turns on the negative-electrode-side switching element 32a and turns off the positive-electrode-side switching element 32b as a steady-state operation. Thus, the converter 3 energizes the reactor 31. Then, the converter 3 turns off the negative-electrode-side switching element 32a and turns on the positive-electrode-side switching element 32b. Thus, the converter 3 causes the reactor 31 to generate energy. The converter 3 causes the energy to be accumulated in the high-voltage-side capacitor 36.

The converter 3 alternately repeats the on and off of the negative-electrode-side switching element 32a and the on and off of the positive-electrode-side switching element 32b. Through this repeated operation, energy is accumulated in the high-voltage-side capacitor 36. Therefore, a high-voltage-side voltage boosted to a voltage equal to or higher than the low-voltage-side voltage is output between the high-voltage-side positive electrode terminal and the high-voltage-side negative electrode terminal. The control device 35 changes a duty ratio between the high level and the low level of each of the first gate drive signal S1 and the second gate drive signal S2. That is, the control device 35 changes the timings of the on and off of the negative-electrode-side switching element 32a and the timings of the on and off of the positive-electrode-side switching element 32b. Consequently, the control device 35 can control the value of the high-voltage-side voltage as the output voltage.

Figure 2:
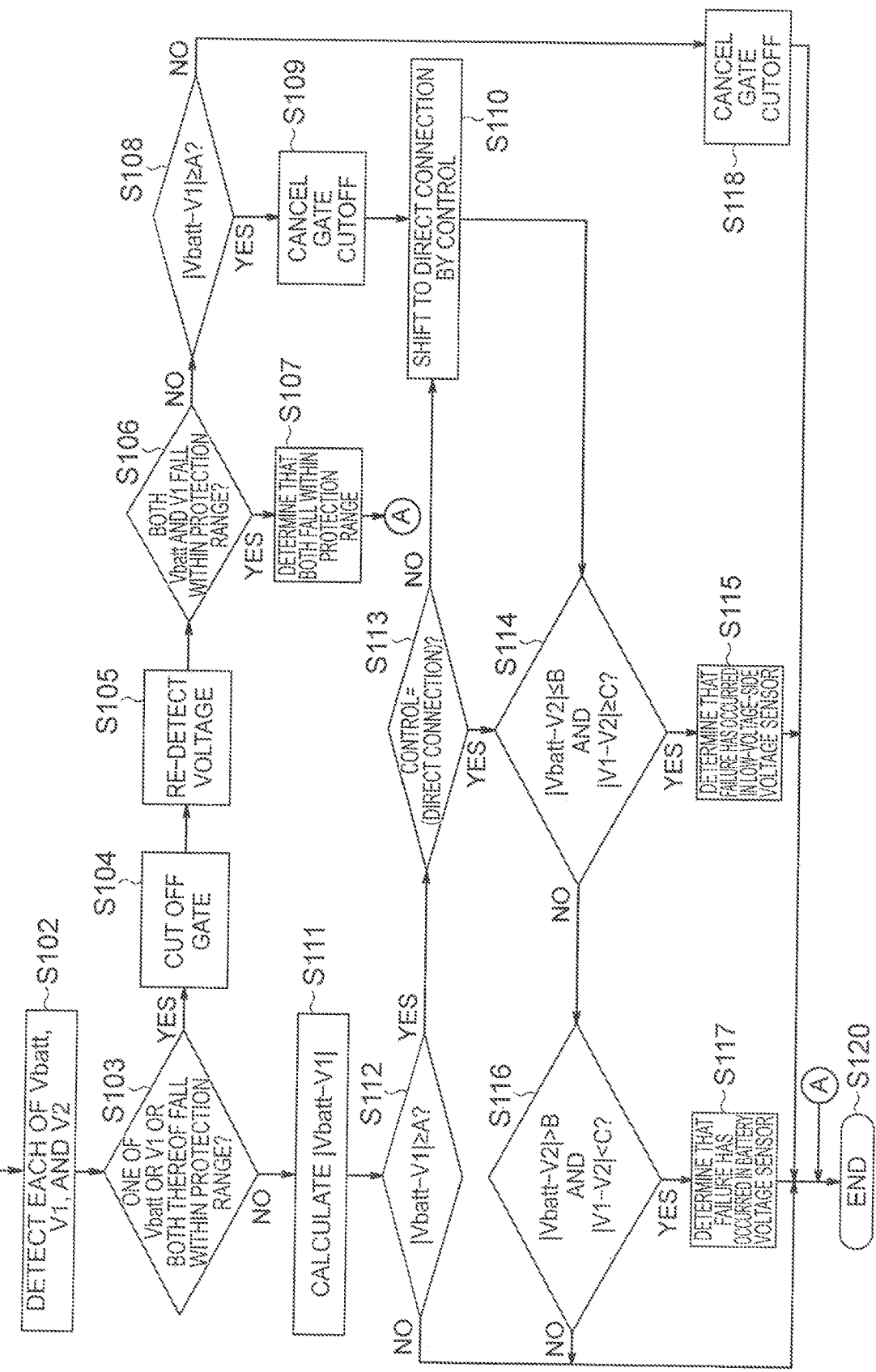
FIG. 2 is a flow chart for illustrating processing to be performed by a control device in the first embodiment.

FIG. 2 is a flow chart for illustrating processing to be performed by the control device 35 in the first embodiment. In the processing illustrated in FIG. 2, failure determination is performed for the battery voltage sensor 4 and the low-voltage-side voltage sensor 38.

In addition, in the processing illustrated in FIG. 2, the start processing step of Step S101 is executed every set time period, for example, every 1 ms.

In Step S102, the control device 35 acquires the battery detection value Vbatt from the battery voltage sensor 4. The control device 35 also acquires the low-voltage-side detection value V1 from the low-voltage-side voltage sensor 38. The control device 35 acquires the high-voltage-side detection value V2 from the high-voltage-side voltage sensor 39.

In Step S103, the control device 35 determines whether or not one of the battery detection value Vbatt or the low-voltage-side detection value V1 or both thereof fall within a protection range. The protection range is a range of equal to or smaller than a undervoltage threshold value or equal to or larger than an overvoltage threshold value. The undervoltage threshold value is, for example, the lower limit of a voltage at which the control can be established. The undervoltage threshold value may be determined by tests. The overvoltage threshold value is, for example, the value of a voltage at which the risk of component destruction is exhibited. The overvoltage threshold value may be determined by tests.

In another case, the protection range may exclude the undervoltage threshold value and the overvoltage threshold value from the range. That is, the protection range may be a range smaller than the undervoltage threshold value or larger than the overvoltage threshold value. In the following description, a value belonging to the protection range is referred to as "abnormal value." Meanwhile, in the following description, a value that does not belong to the protection range is referred to as "normal value."

When one of the battery detection value Vbatt or the low-voltage-side detection value V1 or both thereof are abnormal values, the process advances to Step S104. Meanwhile, when both the battery detection value Vbatt and the low-voltage-side detection value V1 are normal values, the process advances to Step S111.

In Step S104, the control device 35 executes gate cutoff for turning off both the negative-electrode-side switching element 32a and the positive-electrode-side switching element 32b of the main body circuitry 30. Thus, the power supply to the load 2 is cut off.

At the time point of Step S104, the control device 35 cannot discriminate whether the state is a stuck state in which abnormal values are continuously detected due to a failure in the sensor or whether the main body circuitry 30 has actually caused a voltage abnormality. In the first embodiment, the gate cutoff is executed from the viewpoint of preventing damage from being caused to each component even under such a state in which the discrimination has not been completed.

Subsequently, in Step S105, the control device 35 re-detects each of the battery detection value Vbatt, the low-voltage-side detection value V1, and the high-voltage-side detection value V2. The re-detection is not required to be executed at this stage. In another case, the re-detection may be executed after a set time has elapsed from Step S104. In another case, processing for acquiring a detection value from each voltage sensor may be executed for each set cycle asynchronously with the operation of the flow chart of FIG. 2.

In Step S106, the control device 35 determines whether or not both the battery detection value Vbatt and the low-voltage-side detection value V1 are abnormal values. There is a low risk that the two sensors simultaneously cause failures and adhere to abnormal values. Therefore, when both the battery detection value Vbatt and the low-voltage-side detection value V1 are abnormal values, the control device 35 determines that both the battery voltage sensor 4 and the low-voltage-side voltage sensor 38 are normal. Then, in Step S107, the control device 35 determines that a failure has occurred in the main body circuitry 30 of the converter 3.

In Step S107, it is also notified to the outside that a failure has occurred in the main body circuitry 30. After that, the process advances to Step S120 to be ended. In this case, the control device 35 ends the process with the gate being cut off.

When one of the battery detection value Vbatt or the low-voltage-side detection value V1 is an abnormal value in Step S106, in Step S108, the control device 35 calculates the absolute value of a difference between the battery detection value Vbatt and the low-voltage-side detection value V1. Then, the control device 35 compares the calculated value to a threshold value A. The threshold value A may be determined by tests. In another case, the threshold value A may be set on the grounds of an error of the sensor.

When the calculated value is not equal to or larger than the threshold value A, it is regarded in the first embodiment that not a failure but a momentary reading error has occurred. That is, the control device 35 cancels the gate cutoff in Step S118. Then, the control device 35 controls the negative-electrode-side switching element 32a and the positive-electrode-side switching element 32b so that the power supply to the load 2 is restarted. Then, the process advances to Step S120 to be ended.

Meanwhile, when the calculated value is equal to or larger than the threshold value A, the control device 35 determines that a failure has occurred in one of the battery voltage sensor 4 or the low-voltage-side voltage sensor 38. Then, the control device 35 advances the process to Step S109.

In Step S109, the control device 35 cancels the gate cutoff. This enables the on-and-off control of each of the negative-electrode-side switching element 32a and the positive-electrode-side switching element 32b.

In Step S110, the control device 35 causes the high-voltage-side voltage and the low-voltage-side voltage to match with each other. The control for thus causing the high-voltage-side voltage and the low-voltage-side voltage to match with each other is referred to as "direct connection control." In addition, in the first embodiment, a battery voltage is caused to match in the same manner as the low-voltage-side voltage. At this time, the control device 35 outputs the first gate drive signal S1 to the negative-electrode-side switching element 32a. Then, the control device 35 outputs the second gate drive signal S2 to the positive-electrode-side switching element 32b.

The direct connection control is performed by the control device 35 outputting the first gate drive signal S1 and the second gate drive signal S2. The direct connection control is also performed by adjusting the duty ratio between the on and off of each of the negative-electrode-side switching element 32a and the positive-electrode-side switching element 32b.

In Step S114, the control device 35 acquires the battery detection value Vbatt, the low-voltage-side detection value V1, and the high-voltage-side detection value V2 after the direct connection control from the battery voltage sensor 4, the low-voltage-side voltage sensor 38, and the high-voltage-side voltage sensor 39, respectively. Then, the control device 35 determines whether or not the absolute value of a difference between the battery detection value Vbatt and the high-voltage-side detection value V2 is equal to or smaller than a threshold value B. The control device 35 also determines whether or not the absolute value of a difference between the low-voltage-side detection value V1 and the high-voltage-side detection value V2 is equal to or larger than a threshold value C.

When both of the two kinds of determination of Step S114 are satisfied, the low-voltage-side voltage sensor 38 indicates a value different from a value originally expected to be indicated. Therefore, in Step S115, the control device 35 determines that a failure has occurred in the low-voltage-side voltage sensor 38. In addition, it is notified to the outside that a failure has occurred in the low-voltage-side voltage sensor 38. Then, the process advances to Step S120 to be ended.

Meanwhile, when only one of the above-mentioned two kinds of determination is satisfied or both kinds of determination are not satisfied in Step S114, the process advances to Step S116. Then, in Step S116, the control device 35 determines whether or not the absolute value of the difference between the battery detection value Vbatt and the high-voltage-side detection value V2 is larger than the threshold value B. The control device 35 also determines whether or not the absolute value of the difference between the low-voltage-side detection value V1 and the high-voltage-side detection value V2 is smaller than the threshold value C.

When both of the two kinds of determination are satisfied in Step S116, the battery voltage sensor 4 indicates a value different from a value originally expected to be indicated. Therefore, in Step S117, the control device 35 determines that a failure has occurred in the battery voltage sensor 4. In addition, it is notified to the outside that a failure has occurred in the battery voltage sensor 4. Then, the process advances to Step S120 to be ended.

Meanwhile, when only one of the above-mentioned two kinds of determination is satisfied or both kinds of determination are not satisfied in Step S116, the control device 35 determines that both the battery voltage sensor 4 and the low-voltage-side voltage sensor 38 are normal. Therefore, the process directly advances to Step S120 to be ended.

As described above, the high-voltage-side voltage sensor 39 has been confirmed and notified to be normal based on the comparison between the high-voltage-side detection value V2 and the voltage of the load 2. Therefore, in Step S114 and Step S116, the determination is performed on the assumption that the high-voltage-side voltage sensor 39 is normal. In addition, the threshold value B and the threshold value C may be set by tests, or may be set on the grounds of an error of the sensor.

The description is returned to the determination processing step of Step S103. In Step S103, when the battery detection value Vbatt obtained by the battery voltage sensor 4 and the low-voltage-side detection value V1 obtained by the low-voltage-side voltage sensor 38 are normal values, the process advances to Step S111. Then, in Step S111, the control device 35 calculates the absolute value of the difference between the battery detection value Vbatt and the low-voltage-side detection value V1.

When the absolute value of the calculated difference is smaller than the threshold value A in Step S112, the control device 35 regards that no failure has occurred, and the process advances to Step S120 to be ended. When the value calculated in Step S111 is equal to or larger than the threshold value A, the process advances to Step S113.

In Step S113, the control device 35 determines whether or not the direct connection control is in progress.

When the direct connection control is not in progress in Step S113, the process advances to Step S110. Meanwhile, when the direct connection control is in progress in Step S113, the process advances to Step S114.

The control device 35 may advance the process to Step S109 when a state in which the calculated value is equal to or larger than the threshold value A has occurred a plurality of times in Step S108.

Further, the control device 35 may advance the process to Step S113 when a state in which the value calculated in Step S111 is equal to or larger than the threshold value A has occurred a plurality of times in Step S112.

Further, the control device 35 may advance the process to Step S115 when a state in which both of the two kinds of determination are satisfied has occurred a plurality of times in Step S114.

Further, the control device 35 may advance the process to Step S117 when a state in which both of the two kinds of determination are satisfied has occurred a plurality of times in Step S116.

The control device 35 in the first embodiment described above performs the gate cutoff for cutting off the power supply to the load 2 when one of the battery detection value Vbatt or the low-voltage-side detection value V1 or both thereof are abnormal values. Then, after performing the gate cutoff, the control device 35 performs a first determination processing step of determining whether or not the main body circuitry 30 is abnormal based on the battery detection value Vbatt and the low-voltage-side detection value V1.

Further, when the control device 35 determines that the main body circuitry 30 is not abnormal in the first determination processing step, the control device 35 performs a second determination processing step. This second determination processing step is a processing step of determining which of the battery voltage sensor 4 and the low-voltage-side voltage sensor 38 is abnormal based on the battery detection value Vbatt, the low-voltage-side detection value V1, and the high-voltage-side detection value V2.

Therefore, the converter 3 in the first embodiment performs the gate cutoff, to thereby be able to prevent damage from being caused to each component due to a voltage abnormality. Further, the converter 3 performs the second determination processing step, to thereby be able to determine whether the voltage sensor is abnormal. That is, the converter 3 can perform the abnormality determination of the voltage sensor while preventing damage from being caused to each component due to a voltage abnormality. Further, the converter 3 can isolate a malfunction as to which of the main body circuitry 30, the battery voltage sensor 4, and the low-voltage-side voltage sensor 38 has caused an abnormality.

Further, when the control device 35 determines in the first determination processing step that the main body circuitry 30 is not abnormal, the control device 35 cancels the gate cutoff to perform the second determination processing step. Therefore, the converter 3 can perform abnormality determination of each sensor while operating the main body circuitry 30. Further, the converter 3 can operate the power propagation system 5 while using one of the battery voltage sensor 4 or the low-voltage-side voltage sensor 38 that has not caused a failure.

Further, the control device 35 performs the direct connection control for causing the voltage on the high-voltage side and the voltage on the low-voltage side to match with each other after canceling the gate cutoff. Further, the control device 35 performs the second determination processing step after performing the direct connection control. Therefore, the converter 3 can reduce the difference value between the voltage on the high-voltage side and the voltage on the low-voltage side for use in the second determination processing step. This narrows down an allowable range defined by threshold values. Therefore, occurrence of erroneous detection is suppressed.

Further, when the control device 35 determines that the main body circuitry 30 is not abnormal in the first determination processing step, the control device 35 determines whether or not the absolute value of the difference between the battery detection value Vbatt and the low-voltage-side detection value V1 is equal to or larger than the threshold value. When the absolute value of the difference is equal to or larger than the threshold value, the control device 35 performs the second determination processing step. Therefore, the converter 3 can confirm that a failure has occurred in one of the battery voltage sensor 4 or the low-voltage-side voltage sensor 38 before performing the second determination processing step.

Second Embodiment

Next, a second embodiment of this disclosure is described. A configuration of the power propagation system 5 in the second embodiment is the same as the configuration of the first embodiment.

Figure 3:
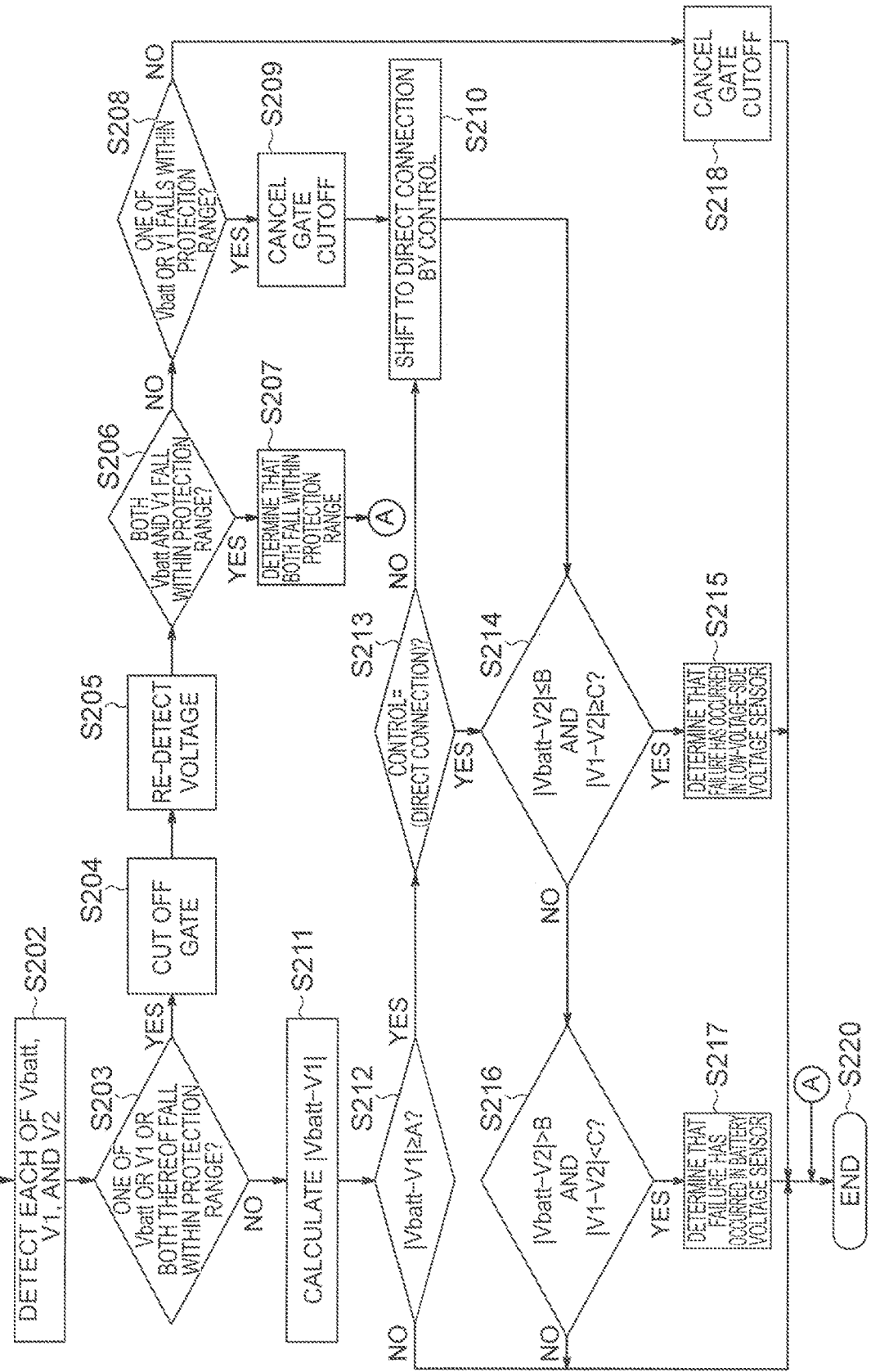
FIG. 3 is a flow chart for illustrating processing to be performed by a control device in a second embodiment of this disclosure.

FIG. 3 is a flow chart for illustrating processing to be performed by the control device 35 in the second embodiment.

Step S201 to Step S205 in the second embodiment are the same as Step S101 to Step S105 in the first embodiment.

In Step S206, the control device 35 determines whether both the battery detection value Vbatt and the low-voltage-side detection value V1 are abnormal values. When both are abnormal values, the control device 35 determines that a failure has occurred in none of the battery voltage sensor 4 and the low-voltage-side voltage sensor 38.

Then, in Step S207, the control device 35 determines that a failure has occurred in the main body circuitry 30 of the converter 3. In addition, it is notified to the outside that a failure has occurred in the main body circuitry 30. After that, the process advances to Step S220 to be ended. In this case, the control device 35 ends the process with the gate being cut off.

When both the battery detection value Vbatt and the low-voltage-side detection value V1 are not abnormal values in Step S206, the process advances to Step S208. Then, in Step S208, the control device 35 determines whether one of the battery detection value Vbatt or the low-voltage-side detection value V1 is an abnormal value, that is, a value belonging to the protection range. When none of the values is an abnormal value, the process advances to Step S218.

Meanwhile, when the one of battery detection value Vbatt or the low-voltage-side detection value V1 is an abnormal value in Step S208, the process advances to Step S209.

The operation of from Step S209 to Step S220 is the same as the operation of from Step S109 to Step S120 in the first embodiment.

The control device 35 may advance the process to Step S209 when a state in which one of the battery detection value Vbatt or the low-voltage-side detection value V1 is an abnormal value has occurred a plurality of times in Step S208.

When the control device 35 in the second embodiment described above determines that the main body circuitry 30 is not abnormal, the control device 35 determines whether or not one of the battery detection value Vbatt or the low-voltage-side detection value V1 falls out of the range defined by the undervoltage threshold value and the overvoltage threshold value. When one thereof falls out of the range, the control device 35 determines which sensor is abnormal. Therefore, the converter 3 can confirm that a failure has occurred in one of the battery voltage sensor 4 or the low-voltage-side voltage sensor 38 before performing the abnormality determination of each sensor.

Further, the converter 3 can perform the abnormality determination of the sensor as long as one of the battery detection value Vbatt or the low-voltage-side detection value V1 is an abnormal value.

Third Embodiment

Figure 4:
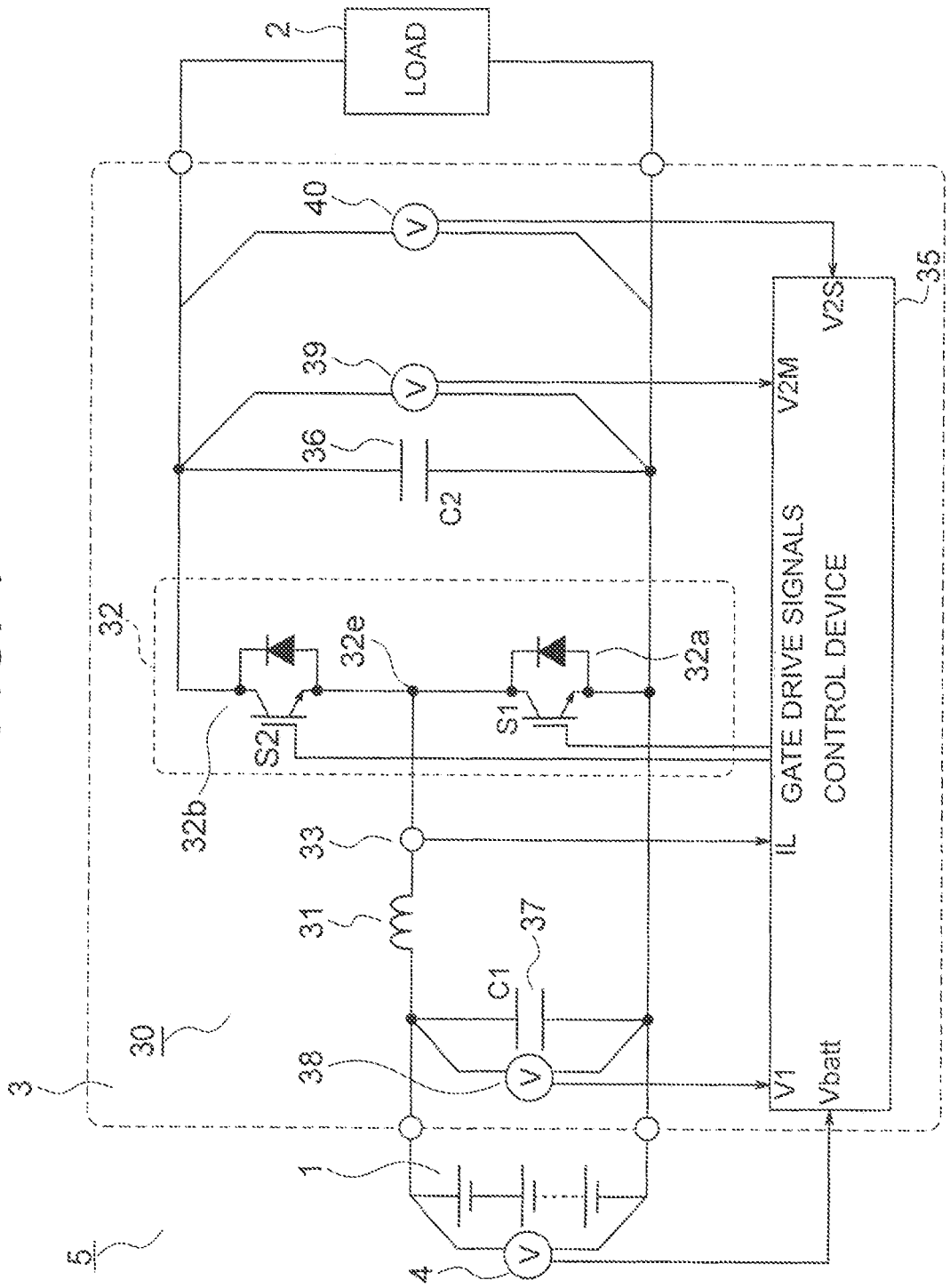
FIG. 4 is a diagram for illustrating a configuration of a power propagation system in a third embodiment of this disclosure.

FIG. 4 is a configuration diagram for illustrating a configuration of a power conversion device in a third embodiment of this disclosure.

The converter 3 in the third embodiment further includes a second high-voltage-side voltage sensor 40 for detecting the high-voltage-side voltage, in addition to the high-voltage-side voltage sensor 39 for detecting the high-voltage-side voltage. In this manner, the converter 3 includes two voltage sensors for detecting the high-voltage-side voltage.

In addition, the load 2 in the third embodiment does not output the information value Info to the control device 35.

In addition, the control device 35 in the third embodiment acquires a high-voltage-side detection value V2M from the high-voltage-side voltage sensor 39. Then, the control device 35 acquires a second high-voltage-side detection value V2S from the second high-voltage-side voltage sensor 40.

Configurations other than the above-mentioned configurations are the same as those in the first embodiment.

Figure 5:
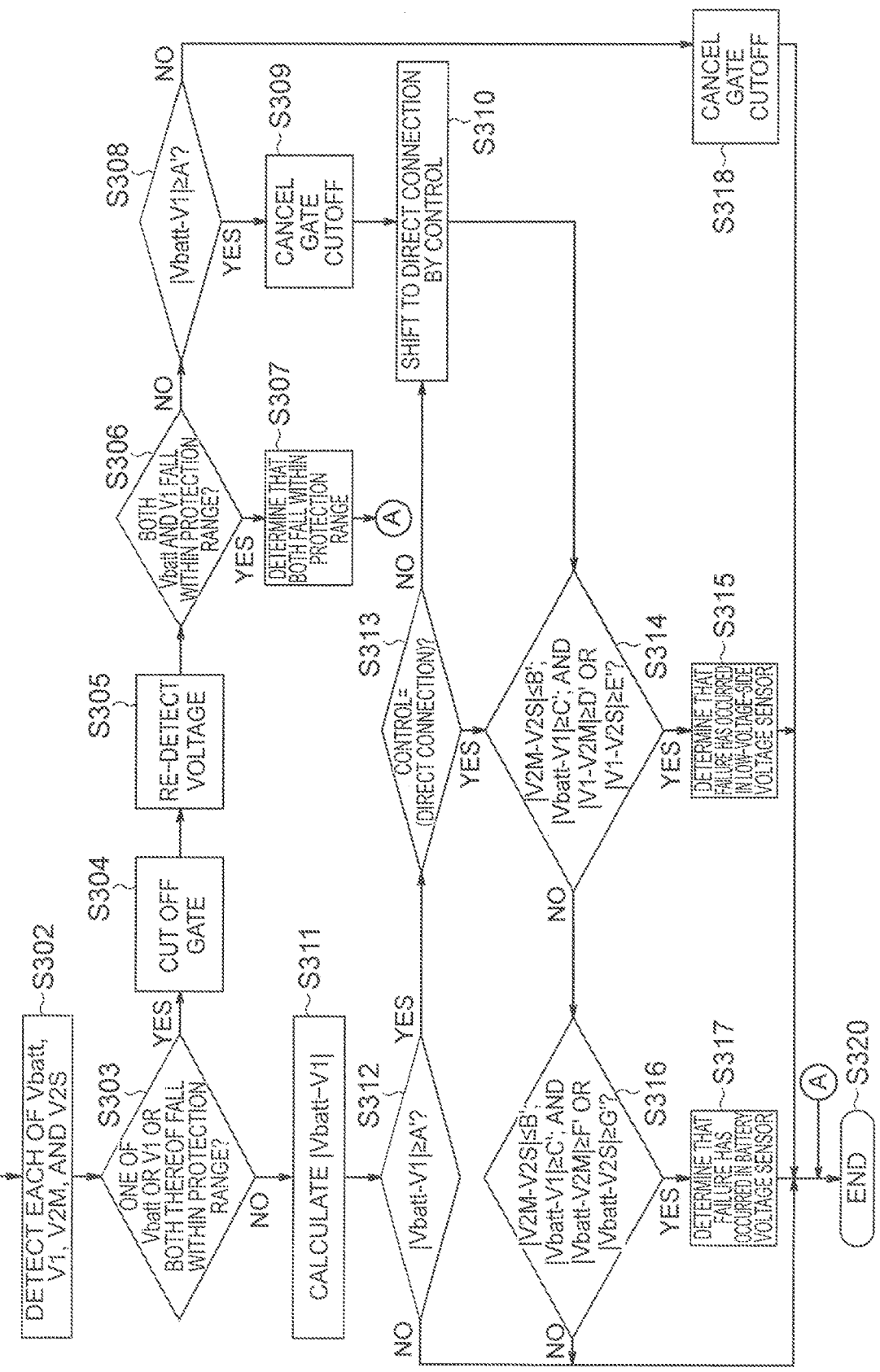
FIG. 5 is a flow chart for illustrating processing to be performed by a control device in the third embodiment.

FIG. 5 is a flow chart for illustrating processing to be performed by the control device 35 in the third embodiment. In the processing of FIG. 5, the start processing step of Step S301 is executed every set time period, for example, every 1 ms.

In Step S302, the control device 35 acquires the battery detection value Vbatt from the battery voltage sensor 4. The control device 35 acquires the low-voltage-side detection value V1 from the low-voltage-side voltage sensor 38. The control device 35 acquires the high-voltage-side detection value V2M from the high-voltage-side voltage sensor 39. Then, the control device 35 acquires the second high-voltage-side detection value V2S from the second high-voltage-side voltage sensor 40.

Subsequent processing steps of from Step S303 to Step S310 are the same as the processing steps of from Step S103 to Step S110 in the first embodiment. Step S311 to Step S313 are also the same as Step S111 to Step S113 in the first embodiment. The processing step of Step S318 is also the same as that of Step S118 in the first embodiment. When the direct connection control is in progress in Step S313, and after the direct connection control is performed in Step S310, the process advances to Step S314.

In Step S314, the control device 35 acquires the battery detection value Vbatt, the low-voltage-side detection value V1, the high-voltage-side detection value V2M, and the second high-voltage-side detection value V2S after the direct connection control. Then, the control device 35 determines whether or not the absolute value of a difference between the high-voltage-side detection value V2M and the second high-voltage-side detection value V2S is equal to or smaller than a threshold value B'. When the absolute value of the difference is not equal to or smaller than the threshold value B', the process advances to Step S316. When the absolute value of the difference is equal to or smaller than the threshold value B', the control device 35 can confirm and notify that both the high-voltage-side voltage sensor 39 and the second high-voltage-side voltage sensor 40 are normal.

Then, the control device 35 determines whether or not the absolute value of the difference between the battery detection value Vbatt and the low-voltage-side detection value V1 is equal to or larger than a threshold value C' and at least one of the following two conditions is satisfied.

The absolute value of a difference between the low-voltage-side detection value V1 and the high-voltage-side detection value V2M is equal to or larger than a threshold value D'.

The absolute value of a difference between the low-voltage-side detection value V1 and the second high-voltage-side detection value V2S is equal to or larger than a threshold value E'.

When the above-mentioned conditions are satisfied, in Step S315, the control device 35 determines that the low-voltage-side voltage sensor 38 has a failure. In addition, it is notified to the outside that a failure has occurred in the low-voltage-side voltage sensor 38. Then, the process advances to Step S320 to be ended. Meanwhile, when the above-mentioned conditions are not satisfied, the process advances to Step S316.

In Step S316, in the same manner as in Step S314, the control device 35 determines whether or not the absolute value of the difference between the high-voltage-side detection value V2M and the second high-voltage-side detection value V2S is equal to or smaller than the threshold value B'. When the absolute value of the difference is not equal to or smaller than the threshold value B', the process advances to Step S320 to be ended. In this case, there is a fear that a failure has occurred in one of the high-voltage-side voltage sensor 39 or the second high-voltage-side voltage sensor 40. Therefore, this fear is notified to the outside. Meanwhile, when the absolute value of the difference is equal to or smaller than the threshold value B', the control device 35 can confirm and notify that both the high-voltage-side voltage sensor 39 and the second high-voltage-side voltage sensor 40 are normal.

Then, the control device 35 determines whether the absolute value of the difference between the battery detection value Vbatt and the low-voltage-side detection value V1 is equal to or larger than the threshold value C' and at least one of the following two conditions is satisfied.

The absolute value of the difference between the battery detection value Vbatt and the high-voltage-side detection value V2M is equal to or larger than a threshold value F'.

The absolute value of the difference between the battery detection value Vbatt and the second high-voltage-side detection value V2S is equal to or larger than a threshold value G'.

When the above-mentioned conditions are satisfied, in Step S317, the control device 35 determines that a failure has occurred in the battery voltage sensor 4. In addition, it is notified to the outside that a failure has occurred in the battery voltage sensor 4. Then, the process advances to Step S320 to be ended. Meanwhile, when the above-mentioned conditions are not satisfied, the process directly advances to Step S320 to be ended.

The threshold value B' to the threshold value G' may be set by tests, or may be set on the grounds of an error of the sensor.

The control device 35 may advance the process to Step S315 when a state in which the determination conditions are satisfied has occurred a plurality of times in Step S314.

Further, the control device 35 may advance the process to Step S317 when a state in which the determination conditions are satisfied has occurred a plurality of times in Step S316.

The converter 3 in the third embodiment described above further includes the second high-voltage-side voltage sensor 40 for detecting the voltage on the high-voltage side of the main body circuitry 30 separately from the high-voltage-side voltage sensor 39. In addition, the control device 35 further acquires the second high-voltage-side detection value V2S being a detection value obtained by the second high-voltage-side voltage sensor 40.

Therefore, even when the converter 3 cannot acquire information on the voltage from the load 2, the converter 3 can perform the abnormality determination of the sensor through use of output of the high-voltage-side voltage sensor 39 and output of the second high-voltage-side voltage sensor 40.

Fourth Embodiment

Next, a fourth embodiment of this disclosure is described. A configuration of the power propagation system 5 in the fourth embodiment is the same as the configuration of the third embodiment.

Figure 6:
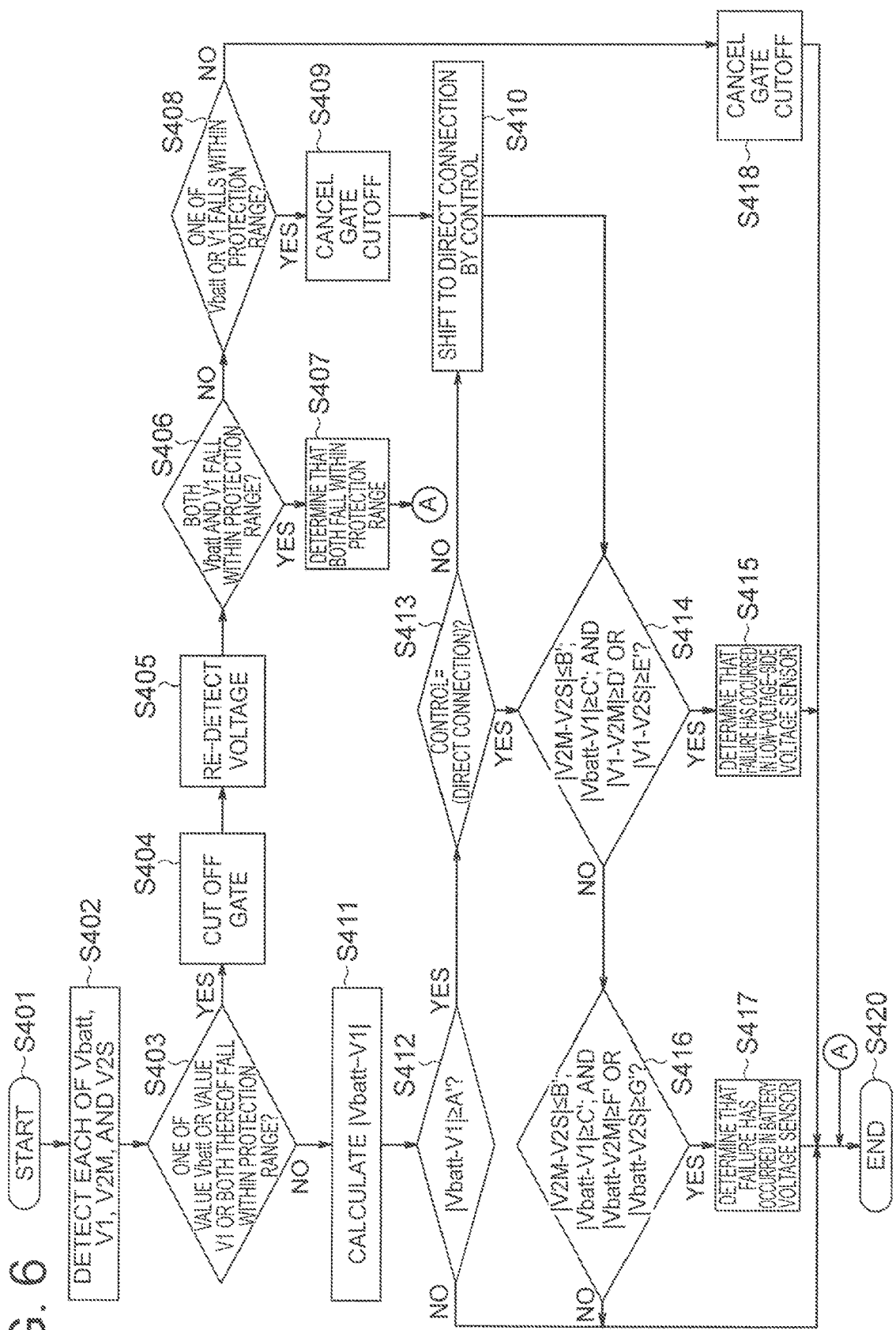
FIG. 6 is a flow chart for illustrating processing to be performed by a control device in a fourth embodiment of this disclosure.

FIG. 6 is a flow chart for illustrating processing to be performed by the control device 35 in the fourth embodiment.

Step S401 to Step S405 in the fourth embodiment are the same as Step S301 to Step S305 in the third embodiment.

In Step S406, the control device 35 determines whether both the battery detection value Vbatt and the low-voltage-side detection value V1 are abnormal values. When both are abnormal values, the control device 35 determines that a failure has occurred in none of the battery voltage sensor 4 and the low-voltage-side voltage sensor 38.

Then, in Step S407, the control device 35 determines that a failure has occurred in the main body circuitry 30 of the converter 3. In addition, it is notified to the outside that a failure has occurred in the main body circuitry 30. After that, the process advances to Step S420 to be ended. In this case, the control device 35 ends the process with the gate being cut off.

When both the battery detection value Vbatt and the low-voltage-side detection value V1 are not abnormal values in Step S406, the process advances to Step S408. Then, in Step S408, the control device 35 determines whether one of the battery detection value Vbatt or the low-voltage-side detection value V1 is an abnormal value, that is, a value within the protection range. When none of the values is an abnormal value, the process advances to Step S418.

Meanwhile, when the one of battery detection value Vbatt or the low-voltage-side detection value V1 is an abnormal value in Step S408, the process advances to Step S409.

The operation of from Step S409 to Step S420 is the same as the operation of from Step S309 to Step S320 in the third embodiment.

The control device 35 may advance the process to Step S409 when a state in which one of the battery detection value Vbatt or the low-voltage-side detection value V1 is an abnormal value has occurred a plurality of times in Step S408.

In the same manner as in the third embodiment, even when the information on the voltage cannot be acquired from the load 2, the converter 3 in the fourth embodiment described above can perform the abnormality determination of the sensor through use of the output of the high-voltage-side voltage sensor 39 and the output of the second high-voltage-side voltage sensor 40. Further, the converter 3 can perform the abnormality determination of the sensor as long as one of the battery detection value Vbatt or the low-voltage-side detection value V1 is an abnormal value.

Fifth Embodiment

Figure 7:
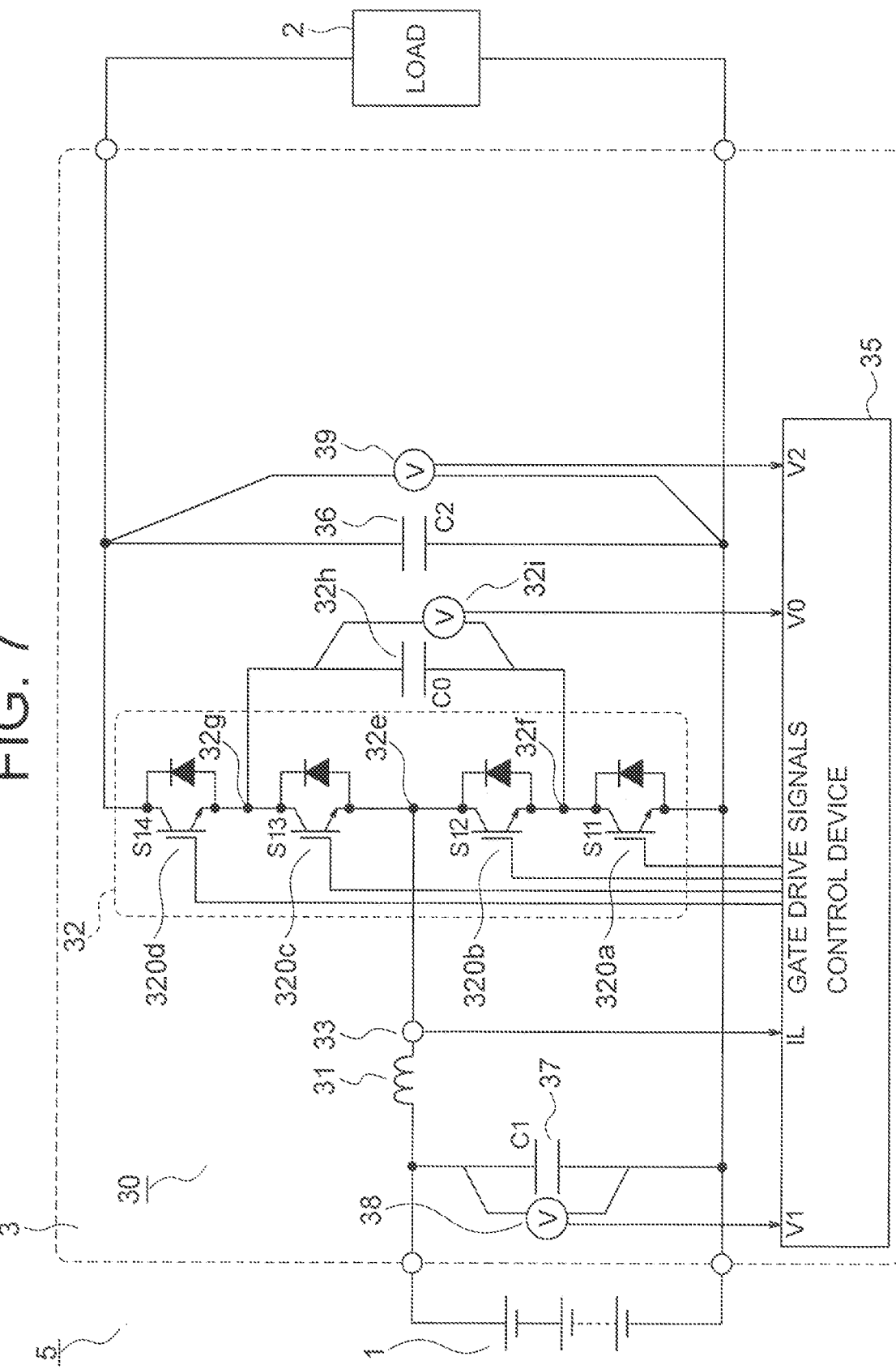
FIG. 7 is a diagram for illustrating a configuration of a power propagation system in a fifth embodiment of this disclosure.

FIG. 7 is a configuration diagram for illustrating a configuration of a power conversion device in a fifth embodiment of this disclosure.

<Power Conversion Circuit>

The power conversion circuit 32 in the fifth embodiment includes a positive-electrode-side switching element 320d. The power conversion circuit 32 includes a negative-electrode-side switching element 320a. The power conversion circuit 32 includes two intermediate-side switching elements, namely, a first intermediate-side switching element 320b and a second intermediate-side switching element 320c. The switching elements 320a to 320d is connected in series to each other.

One end of the negative-electrode-side switching element 320a is connected to the negative-electrode-side terminal of the low-voltage-side capacitor 37 through the wiring on the negative electrode side. The one end of the negative-electrode-side switching element 320*a* is also connected to the negative electrode of the battery 1 and one electrode of the load 2. The other end of the negative-electrode-side switching element 320*a* is connected to one end of the first intermediate-side switching element 320*b*.

The other end of the first intermediate-side switching element 320*b* is connected to one end of the second intermediate-side switching element 320*c*. The other end of the second intermediate-side switching element 320*c* is connected to one end of the positive-electrode-side switching element 320*d*. The other end of the positive-electrode-side switching element 320*d* is connected to the positive-electrode-side terminal of the high-voltage-side capacitor 36 and the other electrode of the load 2.

The first connection point 32*e* is a connection point between the first intermediate-side switching element 320*b* and the second intermediate-side switching element 320*c*. A second connection point 32*f* is a connection point between the negative-electrode-side switching element 320*a* and the first intermediate-side switching element 320*b*. A third connection point 32*g* is a connection point between the second intermediate-side switching element 320*c* and the positive-electrode-side switching element 320*d*.

For example, an IGBT may be used as each of the switching elements 320*a* to 320*d*. In another example, an FET may be used as each of the switching elements 320*a* to 320*d*. In another example, normal bipolar transistors each including a diode connected in antiparallel thereto may be used as the switching elements 320*a* to 320*d*.

The control device 35 outputs a first gate drive signal S11, a second gate drive signal S12, a third gate drive signal S13, and a fourth gate drive signal S14. In this case, the negative-electrode-side switching element 320*a* is turned on when the first gate drive signal S11 is at a high level and is turned off when the first gate drive signal S11 is at a low level. The first intermediate-side switching element 320*b* is turned on when the second gate drive signal S12 is at a high level and is turned off when the second gate drive signal S12 is at a low level. The second intermediate-side switching element 320*c* is turned on when the third gate drive signal S13 is at a high level and is turned off when the third gate drive signal S13 is at a low level. The positive-electrode-side switching element 320*d* is turned on when the fourth gate drive signal S14 is at a high level and is turned off when the fourth gate drive signal S14 is at a low level. In this manner, each of the switching elements 320*a* to 320*d* is individually controlled by the control device 35.

A parallel connection unit may be used in place of at least one of the negative-electrode-side switching element 320*a*, the first intermediate-side switching element 320*b*, the second intermediate-side switching element 320*c*, or the positive-electrode-side switching element 320*d*. The parallel connection unit is a unit in which a plurality of switching elements are connected in parallel.

<Capacitor and Reactor>

The reactor 31 generates energy to be accumulated in the high-voltage-side capacitor 36. One end of the reactor 31 is connected to the first connection point 32*e*. Meanwhile, the other end of the reactor 31 is connected to the positive electrode of the battery 1.

In the fifth embodiment, an intermediate-side capacitor 32*h* is provided between the two connection points, namely, the second connection point 32*f* and the third connection point 32*g*. The function of the converter 3 is established even without the intermediate-side capacitor 32*h*.

<Sensor>

The converter 3 includes an intermediate voltage sensor 32*i*. The intermediate voltage sensor 32*i* detects a voltage on an intermediate side. The voltage on the intermediate side is a voltage between the positive electrode and the negative electrode of the intermediate-side capacitor 32*h*.

<Control Device>

The control device 35 acquires an intermediate detection value V0 obtained by the intermediate voltage sensor 32*i*. Meanwhile, the control device 35 does not acquire the battery detection value Vbatt obtained by the battery voltage sensor 4 and the information value Info obtained by the load 2.

<Converter>

The converter 3 in the fifth embodiment has different ways of switching control depending on whether a step-up ratio is less than twice or twice or more.

When the step-up ratio is less than twice, the control device 35 turns on the negative-electrode-side switching element 320*a*. The control device 35 also turns off the first intermediate-side switching element 320*b*. The control device 35 also turns on the second intermediate-side switching element 320*c*. The control device 35 also turns off the positive-electrode-side switching element 320*d*. With such control performed by the control device 35, the converter 3 causes the energy generated by the energization of the reactor 31 to be accumulated in the intermediate-side capacitor 32*h*.

Subsequently, the control device 35 turns off the negative-electrode-side switching element 320*a*. The control device 35 also turns off the first intermediate-side switching element 320*b*. The control device 35 also turns on the second intermediate-side switching element 320*c*. The control device 35 also turns on the positive-electrode-side switching element 320*d*. With such control performed by the control device 35, the converter 3 causes the energy generated by the energization of the reactor 31 to be accumulated in the high-voltage-side capacitor 36.

Subsequently, the control device 35 turns off the negative-electrode-side switching element 320*a*. The control device 35 also turns on the first intermediate-side switching element 320*b*. The control device 35 also turns off the second intermediate-side switching element 320*c*. The control device 35 also turns on the positive-electrode-side switching element 320*d*. With such control performed by the control device 35, the converter 3 causes the energy accumulated in the intermediate-side capacitor 32*h* to be accumulated in the high-voltage-side capacitor 36.

Subsequently, the control device 35 turns off the negative-electrode-side switching element 320*a*. The control device 35 also turns off the first intermediate-side switching element 320*b*. The control device 35 also turns on the second intermediate-side switching element 320*c*. The control device 35 also turns on the positive-electrode-side switching element 320*d*. With such control performed by the control device 35, the converter 3 causes the energy generated by the energization of the reactor 31 to be accumulated in the high-voltage-side capacitor 36.

The converter 3 repeats this cycle. Through repetition of this process, the converter 3 boosts the low-voltage-side voltage so that the step-up ratio between the low-voltage-side voltage and the high-voltage-side voltage becomes less than twice.

Meanwhile, when the step-up ratio is twice or more, the control device 35 turns on the negative-electrode-side switching element 320*a*. The control device 35 also turns on the first intermediate-side switching element 320*b*. The control device 35 also turns off the second intermediate-side switching element 320c. The control device 35 also turns off the positive-electrode-side switching element 320d. With such control performed by the control device 35, the converter 3 energizes the reactor 31 to cause energy.

Subsequently, the control device 35 turns on the negative-electrode-side switching element 320a. The control device 35 also turns off the first intermediate-side switching element 320b. The control device 35 also turns on the second intermediate-side switching element 320c. The control device 35 also turns off the positive-electrode-side switching element 320d. With such control performed by the control device 35, the converter 3 causes the energy generated by the energization of the reactor 31 to be accumulated in the intermediate-side capacitor 32h.

Subsequently, the control device 35 turns on the negative-electrode-side switching element 320a. The control device 35 also turns on the first intermediate-side switching element 320b. The control device 35 also turns off the second intermediate-side switching element 320c. The control device 35 also turns off the positive-electrode-side switching element 320d. With such control performed by the control device 35, the converter 3 energizes the reactor 31 to cause energy.

Subsequently, the control device 35 turns off the negative-electrode-side switching element 320a. The control device 35 also turns on the first intermediate-side switching element 320b. The control device 35 also turns off the second intermediate-side switching element 320c. The control device 35 also turns on the positive-electrode-side switching element 320d. With such control performed by the control device 35, the converter 3 causes the energy accumulated in the intermediate-side capacitor 32h to be accumulated in the high-voltage-side capacitor 36.

The converter 3 repeats this cycle. Through repetition of this process, the converter 3 boosts the low-voltage-side voltage so that the step-up ratio between the low-voltage-side voltage and the high-voltage-side voltage becomes twice or more.

The control device 35 changes the duty ratios between the high levels and the low levels of all of the first gate drive signal S11, the second gate drive signal S12, the third gate drive signal S13, and the fourth gate drive signal S14. Thus, the control device 35 changes the timings of the on and off of each of the switching elements 320a to 320d. Therefore, the control device 35 can control the value of the high-voltage-side voltage.

Configurations other than the above-mentioned configurations are the same as those in the first embodiment.

Figure 8:
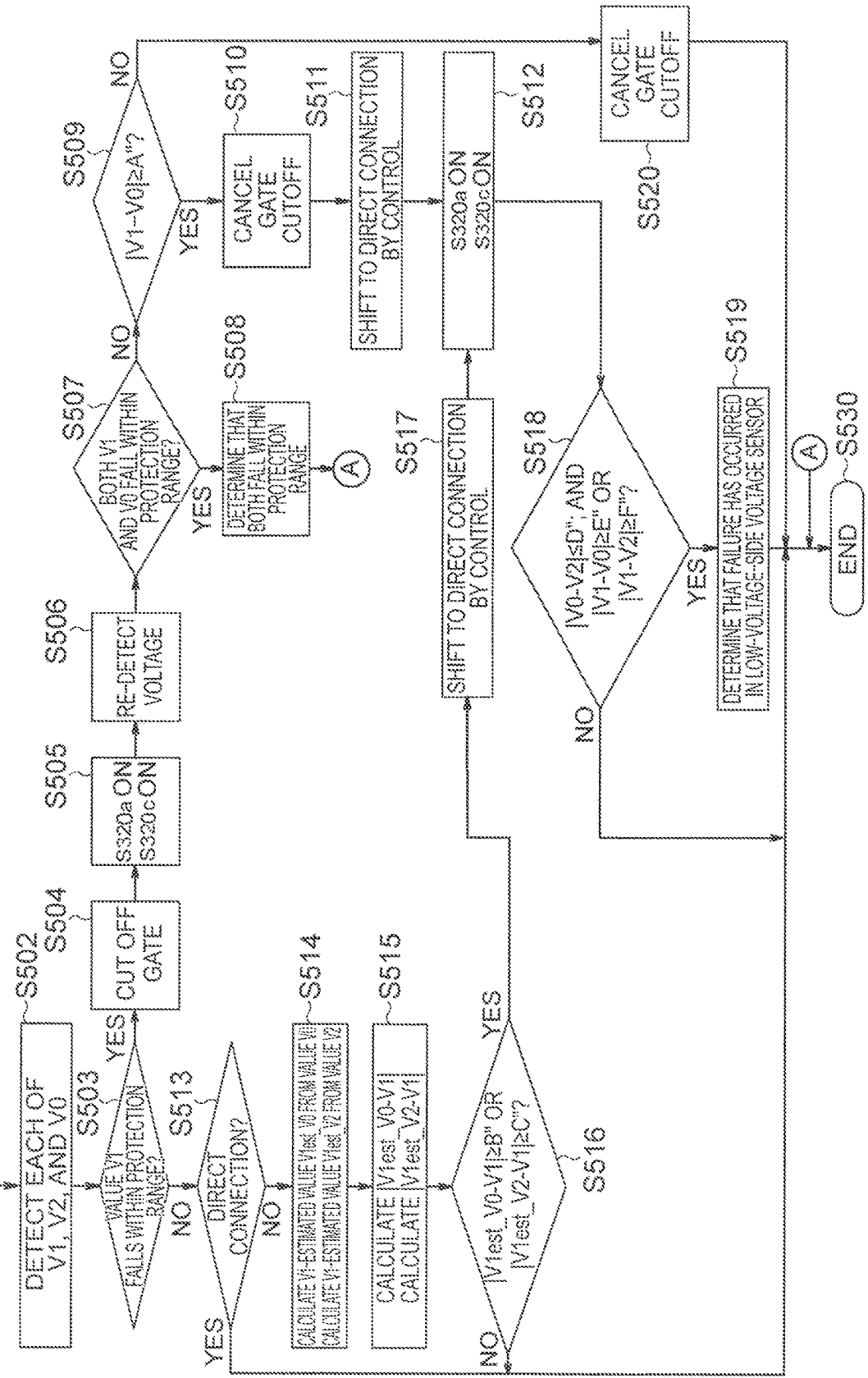
FIG. 8 is a flow chart for illustrating processing to be performed by a control device in the fifth embodiment.

FIG. 8 is a flow chart for illustrating processing to be performed by the control device 35 in the fifth embodiment.

In the processing of FIG. 8, the start processing step of Step S501 is executed every set time period, for example, every 1 ms.

In Step S502, the control device 35 acquires the low-voltage-side detection value V1 from the low-voltage-side voltage sensor 38. The control device 35 acquires the high-voltage-side detection value V2 from the high-voltage-side voltage sensor 39. The control device 35 acquires the intermediate detection value V0 from the intermediate voltage sensor 32i.

In Step S503, the control device 35 determines whether or not the low-voltage-side detection value V1 is an abnormal value. When the low-voltage-side detection value V1 is an abnormal value, the control device 35 advances the process to Step S504. Meanwhile, when the low-voltage-side detection value V1 is a normal value, the control device 35 advances the process to Step S513.

In Step S504, the control device 35 executes a gate cutoff for turning off all the switching elements 320a to 320d. Thus, the power supply to the load 2 is cut off.

In Step S505, the control device 35 turns on the second intermediate-side switching element 320c. Thus, a positive electrode side of the low-voltage-side capacitor 37 and a positive electrode side of the intermediate-side capacitor 32h have the same potential. Meanwhile, the control device 35 turns on the negative-electrode-side switching element 320a. Thus, a negative electrode side of the low-voltage-side capacitor 37 and a negative electrode side of the intermediate-side capacitor 32h have the same potential.

Through this control performed in Step S505, the voltage of the low-voltage-side capacitor 37 and the voltage of the intermediate-side capacitor 32h become the same. The gate cutoff performed in Step S504 is temporarily canceled when Step S505 is performed. Even after Step S505 is performed, the off state of the positive-electrode-side switching element 320d is maintained. Therefore, the power supply to the load 2 remains being cut off.

In Step S506, the control device 35 re-detects each of the voltages of the low-voltage-side voltage sensor 38, the high-voltage-side voltage sensor 39, and the intermediate voltage sensor 32i. The re-detection is not required to be executed at this stage. In another case, the re-detection may be executed after a set time has elapsed from Step S504. In another case, processing for acquiring a detection value from each voltage sensor may be executed for each set cycle asynchronously with the operation of the flow chart of FIG. 8.

When both the low-voltage-side detection value V1 and the intermediate detection value V0 are abnormal values in Step S507, the control device 35 determines that a failure has occurred in none of the low-voltage-side voltage sensor 38 and the intermediate voltage sensor 32i. Then, in Step S508, the control device 35 determines that a failure has occurred in the main body circuitry 30 of the converter 3. In addition, it is notified to the outside that a failure has occurred in the main body circuitry 30. After that, the process advances to Step S530 to be ended. In this case, the control device 35 ends the process with the gate being cut off.

In Step S507, when one of the low-voltage-side detection value V1 or the intermediate detection value V0 is an abnormal value, in Step S509, the control device 35 calculates the absolute value of a difference between the low-voltage-side detection value V1 and the intermediate detection value V0. Then, the control device 35 compares the calculated value to a threshold value A'. The threshold value A' may be determined by tests. In another case, the threshold value A' may be set on the grounds of an error of the sensor.

When the calculated value is not equal to or larger than the threshold value A', it is regarded in the fifth embodiment that not a failure but a momentary reading error has occurred. That is, the control device 35 cancels the gate cutoff in Step S520. Then, the control device 35 controls each of the switching elements 320a to 320d so that the power supply to the load 2 is restarted. Then, the process advances to Step S530 to be ended.

Meanwhile, when the calculated value is equal to or larger than the threshold value A', the control device 35 determines that a failure has occurred in one of the intermediate voltage sensor 32i or the low-voltage-side voltage sensor 38. Then, the control device 35 advances the process to Step S510.

In Step S510, the control device 35 cancels the gate cutoff. This enables the on-and-off control of each of the switching elements 320a to 320d. In Step S511, the control device 35 performs the direct connection control for causing the high-voltage-side voltage and the low-voltage-side voltage to match with each other. The control device 35 performs the direct connection control by adjusting the duty ratio between the on and off of each of the switching elements 320a to 320d.

After the control device 35 has caused the high-voltage-side voltage and the low-voltage-side voltage to match with each other, in Step S512, the control device 35 turns on the second intermediate-side switching element 320c. Thus, the positive electrode side of the low-voltage-side capacitor 37 and the positive electrode side of the intermediate-side capacitor 32h have the same potential. The control device 35 also turns on the negative-electrode-side switching element 320a. Thus, the negative electrode side of the low-voltage-side capacitor 37 and the negative electrode side of the intermediate-side capacitor 32h have the same potential.

Through this control performed in Step S512, the voltage of the low-voltage-side capacitor 37 and the voltage of the intermediate-side capacitor 32h become the same.

Subsequently, in Step S518, the control device 35 acquires the low-voltage-side detection value V1, the intermediate detection value V0, and the high-voltage-side detection value V2 at a timing at which the low-voltage-side voltage, the intermediate-side voltage, and the high-voltage-side voltage match. Then, the control device 35 determines whether or not the absolute value of a difference between the intermediate detection value V0 and the high-voltage-side detection value V2 is equal to or smaller than a threshold value D".

When the absolute value of the difference is not equal to or smaller than the threshold value D", the process advances to Step S530 to be ended. In this case, there is a fear that a failure has occurred in one of the intermediate voltage sensor 32i or the high-voltage-side voltage sensor 39 or both thereof. Therefore, this fear is notified to the outside.

Meanwhile, when the absolute value of the difference is equal to or smaller than the threshold value D", the control device 35 can confirm and notify that both the intermediate voltage sensor 32i and the high-voltage-side voltage sensor 39 are normal. In this case, the control device 35 then determines whether or not at least one of the following conditions is satisfied.

The absolute value of the difference between the low-voltage-side detection value V1 and the intermediate detection value V0 is equal to or larger than a threshold value E".

The absolute value of the difference between the low-voltage-side detection value V1 and the high-voltage-side detection value V2 is equal to or larger than a threshold value F".

When at least one of those two conditions is satisfied, in Step S519, the control device 35 determines that a failure has occurred in the low-voltage-side voltage sensor 38. In addition, it is notified to the outside that a failure has occurred in the low-voltage-side voltage sensor 38. Then, the process advances to Step S530 to be ended. Meanwhile, when none of those two conditions is satisfied, the process directly advances to Step S530 to be ended.

The threshold value D" to the threshold value F" may all be determined by tests. In another case, the threshold value D" to the threshold value F" may all be set on the grounds of an error of the sensor.

The description is returned to the determination processing step of Step S503. In Step S503, when the low-voltage-side detection value V1 obtained by the low-voltage-side voltage sensor 38 is not an abnormal value, the process advances to Step S513. Then, in Step S513, the control device 35 determines whether or not the direct connection control is in progress.

When the direct connection control is in progress, the negative-electrode-side switching element 320a and the first intermediate-side switching element 320b are turned off. In addition, the second intermediate-side switching element 320c and the positive-electrode-side switching element 320d are turned on. During the direct connection control, the control device 35 is required to maintain the on and off states. Thus, the control device 35 cannot perform the processing step of Step S514 which involves changing the duty ratio as described later.

Therefore, in Step S513, when the direct connection control is in progress, the control device 35 advances the process to Step S530 to end the process. Meanwhile, when the direct connection control is not in progress, the control device 35 advances the process to Step S514.

In Step S514, the control device 35 calculates an estimated value V1est_V0 of the low-voltage-side voltage based on the intermediate detection value V0 obtained by the intermediate voltage sensor 32i. The control device 35 also calculates an estimated value V1est_V2 of the low-voltage-side voltage based on the high-voltage-side detection value V2 obtained by the high-voltage-side voltage sensor 39. The control device 35 can calculate each estimated value through use of the duty ratios of the first gate drive signal S11, the second gate drive signal S12, the third gate drive signal S13, and the fourth gate drive signal S14.

Then, in Step S515, the control device 35 calculates the absolute value of a difference between the estimated value V1est_V0 and the low-voltage-side detection value V1. The control device 35 also calculates the absolute value of a difference between the estimated value V1est_V2 and the low-voltage-side detection value V1.

In Step S516, the control device 35 determines whether or not the absolute value of the difference between the estimated value V1est_V0 and the low-voltage-side detection value V1 is equal to or larger than a threshold value B". Then, the control device 35 determines whether the absolute value of the difference between the estimated value V1est_V2 and the low-voltage-side detection value V1 is equal to or larger than a threshold value C".

When both the absolute values are smaller than the threshold value, it is assumed that the low-voltage-side voltage sensor 38 is normal, and the process advances to Step S530 to be ended. Meanwhile, when one or both thereof are equal to or larger than the threshold value, a value different from the estimated value is detected. Therefore, the control device 35 advances the process to Step S517 to perform failure determination processing for the low-voltage-side voltage sensor 38.

In Step S517, the control device 35 performs the direct connection control for causing the high-voltage-side voltage and the low-voltage-side voltage to match with each other. The control device 35 performs the direct connection control by adjusting the duty ratio between the on and off of each of the switching elements 320a to 320d. After the direct connection control, the process advances to Step S512.

When the low-voltage-side detection value V1 is an abnormal value, the control device 35 in the fifth embodiment controls the main body circuitry 30 to perform the gate cutoff for cutting off the power supply to the load 2. Then, the control device 35 controls the main body circuitry 30 to cause the voltage of the low-voltage-side capacitor 37 and the voltage of the intermediate-side capacitor 32h to match with each other. The control device 35 performs a third determination processing step of determining whether or not the main body circuitry 30 is abnormal based on the low-voltage-side detection value V1 and the intermediate detection value V0 that are detected thereafter.

Further, when the control device 35 determines in the third determination processing step that the main body circuitry 30 is not abnormal, the control device 35 performs a fourth determination processing step of determining whether or not the low-voltage-side voltage sensor 38 is abnormal based on the low-voltage-side detection value V1, the intermediate detection value V0, and the high-voltage-side detection value V2.

The control device 35 may advance the process to Step S510 when a state in which the calculated value is equal to or larger than the threshold value A" has occurred a plurality of times in Step S509.

Further, the control device 35 may advance the process to Step S517 when a state in which the determination conditions are satisfied has occurred a plurality of times in Step S516.

Therefore, the converter 3 can eliminate the requirement for the battery voltage sensor 4. It is also possible to perform the abnormality determination of the low-voltage-side voltage sensor 38 through use of all of the intermediate voltage sensor 32*i* and the high-voltage-side voltage sensor 39. Therefore, the occurrence of erroneous detection can be reduced.

Sixth Embodiment

Next, a sixth embodiment of this disclosure is described. A configuration of the power propagation system 5 in the sixth embodiment is the same as the configuration of the fifth embodiment.

Figure 9:
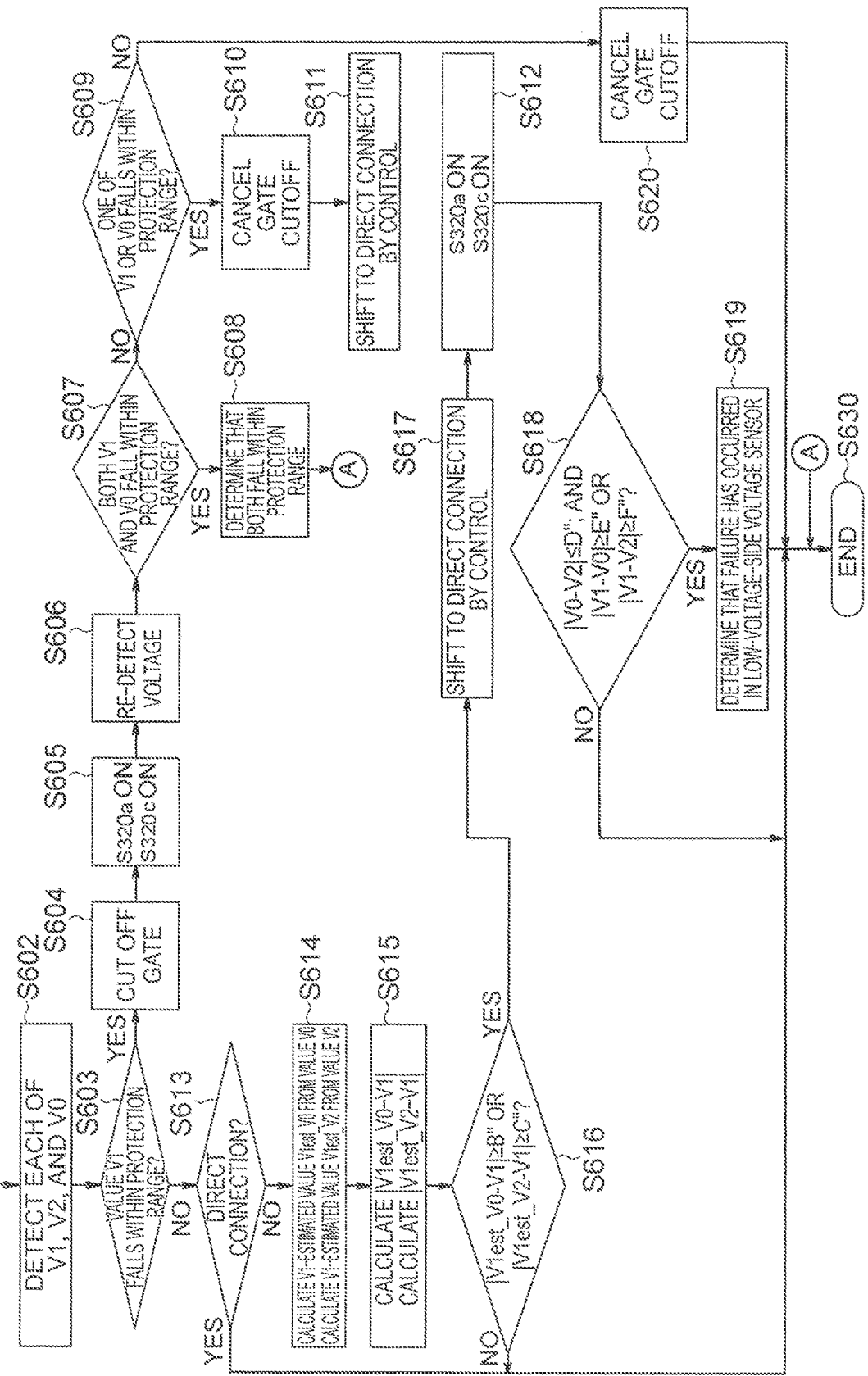
FIG. 9 is a flow chart for illustrating processing to be performed by a control device in a sixth embodiment of this disclosure.

FIG. 9 is a flow chart for illustrating processing to be performed by the control device 35 in the sixth embodiment.

Step S601 to Step S606 in the sixth embodiment are the same as Step S501 to Step S506 in the fifth embodiment.

In Step S607, the control device 35 determines whether both the low-voltage-side detection value V1 and the intermediate detection value V0 are abnormal values. When both the low-voltage-side detection value V1 and the intermediate detection value V0 are abnormal values, the control device 35 determines that a failure has occurred in none of the low-voltage-side voltage sensor 38 and the intermediate voltage sensor 32*i*.

Then, in Step S608, the control device 35 determines that a failure has occurred in the main body circuitry 30 of the converter 3. In addition, it is notified to the outside that a failure has occurred in the main body circuitry 30. After that, the process advances to Step S630 to be ended. In this case, the control device 35 ends the process with the gate being cut off.

When both the low-voltage-side detection value V1 and the intermediate detection value V0 are not abnormal values in Step S607, the process advances to Step S609. Then, in Step S609, the control device 35 determines whether or not one of the low-voltage-side detection value V1 or the intermediate detection value V0 is an abnormal value, that is, a value within the protection range. When none of the values is an abnormal value, the process advances to Step S620.

Meanwhile, when one of the low-voltage-side detection value V1 or the intermediate detection value V0 is an abnormal value in Step S609, the process advances to Step S610.

The operation of from Step S610 to Step S630 is the same as the operation of from Step S510 to Step S530 in the fifth embodiment.

The control device 35 may advance the process to Step S610 when a state in which one of the low-voltage-side detection value V1 or the intermediate detection value V0 is an abnormal value has occurred a plurality of times in Step S609.

In the same manner as in the fifth embodiment, the converter 3 in the sixth embodiment can eliminate the requirement for the battery voltage sensor 4. It is also possible to perform the abnormality determination of the low-voltage-side voltage sensor 38 through use of all of the intermediate voltage sensor 32*i* and the high-voltage-side voltage sensor 39. Therefore, the occurrence of erroneous detection can be reduced.

Further, the converter 3 can perform the abnormality determination of the sensor as long as one of the low-voltage-side detection value V1 or the intermediate detection value V0 is an abnormal value.

Figure 10:
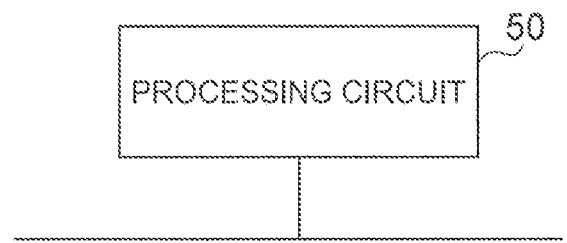
FIG. 10 is a configuration diagram for illustrating a first example of a processing circuit for implementing each function of the control device in each of the first embodiment to the sixth embodiment.

Further, each of the functions of the control device 35 in each of the first embodiment to the sixth embodiment is implemented by a processing circuit. FIG. 10 is a configuration diagram for illustrating a first example of the processing circuit for implementing each function of the control device 35 in each of the first embodiment to the sixth embodiment. A processing circuit 50 in the first example is dedicated hardware.

The processing circuit 50 corresponds to, for example, a single circuit, a composite circuit, a programmed processor, a parallel-programmed processor, an application specific integrated circuit (ASIC), a field programmable gate array (FPGA), or a combination thereof. Further, each of the functions of the control device 35 may be implemented by an individual processing circuit 50. In another case, the functions of the control device 35 may be collectively implemented by the processing circuit 50.

Figure 11:
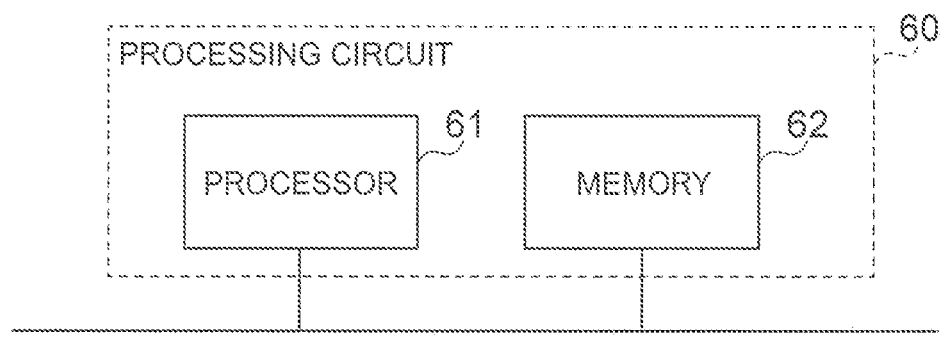
FIG. 11 is a configuration diagram for illustrating a second example of the processing circuit for implementing each function of the control device in each of the first embodiment to the sixth embodiment.

In addition, FIG. 11 is a configuration diagram for illustrating a second example of the processing circuit for implementing each of the functions of the control device 35 in each of the first embodiment to the sixth embodiment. A processing circuit 60 in the second example includes a processor 61 and a memory 62.

In the processing circuit 60, each of the functions of the control device 35 is implemented by software, firmware, or a combination of software and firmware. The software and the firmware are written as programs. Then, the software and the firmware are stored in the memory 62. The processor 61 implements each of the functions of the control device 35 by reading out and executing a program stored in the memory 62.

It is also understood that the programs stored in the memory 62 cause a computer to execute the steps and methods described above for each of the functions of the control device 35 described above. In this case, the memory 62 corresponds to, for example, a random access memory (RAM), a read only memory (ROM), a flash memory, an erasable programmable read only memory (EPROM), an electrically erasable and programmable read only memory (EEPROM), or other such non-volatile or volatile semiconductor memory. The memory 62 also corresponds to, for example, a magnetic disk, a flexible disk, an optical disc, a compact disc, a Mini-Disc, or a DVD.

Some of the functions of the control device 35 described above may be implemented by dedicated hardware, and others thereof may be implemented by software or firmware.

In this manner, the processing circuit can implement each of the functions of the control device 35 described above by hardware, software, firmware, or a combination thereof.

What is claimed is:

1. A power conversion device, comprising:
   a main body circuitry which is connected to a battery and a load, and is configured to convert a first voltage to a second voltage that is higher than the first voltage;
   a low-voltage-side voltage sensor configured to detect the first voltage on a low-voltage side of the main body circuitry;
   a high-voltage-side voltage sensor configured to detect the second voltage on a high-voltage side of the main body circuitry; and
   a control device configured to control the main body circuitry, and to acquire: a low-voltage-side detection value being a detection value obtained by the low-voltage-side voltage sensor; a high-voltage-side detection value being a detection value obtained by the high-voltage-side voltage sensor; and a battery detection value being a detection value obtained by a battery voltage sensor configured to detect a voltage of the battery,
   wherein the control device is configured to:
      control the main body circuitry to perform a gate cutoff for cutting off a power supply to the load when one of the battery detection value or the low-voltage-side detection value or both thereof are abnormal values;
      perform a first determination processing step of determining whether the main body circuitry is abnormal based on the battery detection value and the low-voltage-side detection value after the control device performs the gate cutoff;
      perform a second determination processing step, of determining whether one of the battery voltage sensor or the low-voltage-side voltage sensor is abnormal, based on the battery detection value, the low-voltage-side detection value, and the high-voltage-side detection value when the control device determines in the first determination processing step that the main body circuitry is not abnormal;
      perform the second determination processing step by determining that the low-voltage side voltage sensor is abnormal when an absolute value of a difference between the battery detection value and the high-voltage-side detection value is equal to or smaller than a first predetermined value and an absolute value of a difference between the low-voltage-side detection value and the high-voltage-side detection value is equal to or larger than a second predetermined value; and
      determine that the battery voltage sensor is abnormal when the absolute value of the difference between the battery detection value and the high-voltage-side detection value is larger than the first predetermined value and the absolute value of the difference between the low-voltage-side detection value and the high-voltage-side detection value is smaller than the second predetermined value.

2. The power conversion device according to claim 1, wherein the control device is configured to cancel the gate cutoff and perform the second determination processing step when the control device determines in the first determination processing step that the main body circuitry is not abnormal.

3. The power conversion device according to claim 2, wherein the control device is configured to further control the main body circuitry to perform direct connection control for causing the voltage on the high-voltage side and the voltage on the low-voltage side to match with each other after the control device cancels the gate cutoff, and perform the second determination processing step after the control device performs the direct connection control.

4. The power conversion device according to claim 1, wherein the control device is configured to determine whether an absolute value of a difference between the battery detection value and the low-voltage-side detection value is equal to or larger than a threshold value when the control device determines in the first determination processing step that the main body circuitry is not abnormal, and perform the second determination processing step when the absolute value of the difference is equal to or larger than the threshold value.

5. The power conversion device according to claim 1, wherein the control device is configured to determine whether one of the battery detection value or the low-voltage-side detection value falls out of a range defined by a undervoltage threshold value and an overvoltage threshold value when the control device determines in the first determination processing step that the main body circuitry is not abnormal, and perform the second determination processing step when one of the battery detection value or the low-voltage-side detection value falls out of the range.

6. The power conversion device according to claim 1, further comprising a second high-voltage-side voltage sensor configured to detect the voltage on the high-voltage side of the main body circuitry, the second high-voltage-side voltage sensor being different from the high-voltage-side voltage sensor,
   wherein the control device is configured to further acquire a second high-voltage-side detection value being a detection value obtained by the second high-voltage-side voltage sensor, and perform the second determination processing step based on the battery detection value, the low-voltage-side detection value, the high-voltage-side detection value, and the second high-voltage-side detection value.

7. The power conversion device according to claim 3, wherein the control device is configured to determine whether an absolute value of a difference between the battery detection value and the low-voltage-side detection value is equal to or larger than a threshold value when the control device determines in the first determination processing step that the main body circuitry is not abnormal, and perform the second determination processing step when the absolute value of the difference is equal to or larger than the threshold value.

8. The power conversion device according to claim 7, further comprising a second high-voltage-side voltage sensor configured to detect the voltage on the high-voltage side of the main body circuitry, the second high-voltage-side voltage sensor being different from the high-voltage-side voltage sensor,
   wherein the control device is configured to further acquire a second high-voltage-side detection value being a detection value obtained by the second high-voltage-side voltage sensor, and perform the second determination processing step based on the battery detection value, the low-voltage-side detection value, the high-voltage-side detection value, and the second high-voltage-side detection value.

9. The power conversion device according to claim 3, wherein the control device is configured to determine whether one of the battery detection value or the low-voltage-side detection value falls out of a range defined by a undervoltage threshold value and an overvoltage threshold value when the control device determines in the first determination processing step that the main body circuitry is not abnormal, and perform the second determination processing step when one of the battery detection value or the low-voltage-side detection value falls out of the range.

10. The power conversion device according to claim 9, further comprising a second high-voltage-side voltage sensor configured to detect the voltage on the high-voltage side of the main body circuitry, the second high-voltage-side voltage sensor being different from the high-voltage-side voltage sensor,
wherein the control device is configured to further acquire a second high-voltage-side detection value being a detection value obtained by the second high-voltage-side voltage sensor, and perform the second determination processing step based on the battery detection value, the low-voltage-side detection value, the high-voltage-side detection value, and the second high-voltage-side detection value.

11. The power conversion device according to claim 1, wherein the control device is further configured to:
control the main body circuitry to perform the gate cutoff for cutting off the power supply to the load when the battery detection value is abnormal, when the low-voltage-side detection value is abnormal, and when both of the battery detection values are abnormal; and
perform, in response to the gate cutoff and a re-detecting of at least the low-voltage side detection value and the battery detection value while the power supply to the load is cutoff due to the gate cutoff, the first determination processing step of determining whether the main body circuitry is abnormal based on the battery detection value and the low-voltage-side detection value.

12. A power conversion device, comprising:
a main body circuitry which is connected to a battery and a load, and which is configured to convert a first voltage to a second voltage;
a low-voltage-side voltage sensor configured to detect the first voltage on a low-voltage side of the main body circuitry;
an intermediate voltage sensor;
a high-voltage-side voltage sensor configured to detect the second voltage on a high-voltage side of the main body circuitry; and
a control device configured to control the main body circuitry, and to acquire a low-voltage-side detection value being a detection value obtained by the low-voltage-side voltage sensor, an intermediate detection value being a detection value obtained by the intermediate voltage sensor, and a high-voltage-side detection value being a detection value obtained by the high-voltage-side voltage sensor,
wherein the main body circuitry includes:
a first switching element having one end connected to a negative electrode of the battery and one electrode of the load;
a second switching element having one end connected to the other end of the first switching element;
a third switching element having one end connected to the other end of the second switching element;
a fourth switching element having one end connected to the other end of the third switching element and having the other end connected to the other electrode of the load; and
a reactor having one end connected to a connection point between the second switching element and the third switching element and having the other end connected to a positive electrode of the battery;
wherein the intermediate voltage sensor is configured to detect a voltage between two connection points being a connection point between the first switching element and the second switching element and a connection point between the third switching element and the fourth switching element, and
wherein the control device is configured to:
control the main body circuitry to perform gate cutoff for cutting off power supply to the load when the low-voltage-side detection value is an abnormal value;
control the main body circuitry to cause the voltage on the low-voltage side and the voltage between the two connection points to match with each other, and perform a third determination processing step of determining whether the main body circuitry is abnormal based on the low-voltage-side detection value and the intermediate detection value that are detected after the matching; and
perform a fourth determination processing step of determining whether the low-voltage-side voltage sensor is abnormal based on the low-voltage-side detection value, the intermediate detection value, and the high-voltage-side detection value when the control device determines in the third determination processing step that the main body circuitry is not abnormal.

13. The power conversion device according to claim 12, wherein the control device is configured to cancel the gate cutoff and perform the fourth determination processing step when the control device determines in the third determination processing step that the main body circuitry is not abnormal.

14. The power conversion device according to claim 13, wherein the control device is configured to further control the main body circuitry to perform direct connection control for causing the voltage on the high-voltage side and the voltage on the low-voltage side to match with each other after the control device cancels the gate cutoff, and perform the fourth determination processing step after the control device performs the direct connection control.

15. The power conversion device according to claim 12, wherein the control device is configured to determine whether an absolute value of a difference between the low-voltage-side detection value and the intermediate detection value is equal to or larger than a threshold value when the control device determines in the third determination processing step that the main body circuitry is not abnormal, and perform the fourth determination processing step when the absolute value of the difference is equal to or larger than the threshold value.

16. The power conversion device according to claim 12, wherein the control device is configured to determine whether one of the low-voltage-side detection value or the intermediate detection value falls out of a range defined by a undervoltage threshold value and an overvoltage threshold value when the control device determines in the third determination processing step that the main body circuitry is not abnormal, and perform the fourth determination processing step when one of the low-voltage-side detection value or the intermediate detection value falls out of the range.

17. The power conversion device according to claim 14, wherein the control device is configured to determine whether an absolute value of a difference between the low-voltage-side detection value and the intermediate detection value is equal to or larger than a threshold value when the control device determines in the third determination processing step that the main body circuitry is not abnormal, and perform the fourth determination processing step when the absolute value of the difference is equal to or larger than the threshold value.

18. The power conversion device according to claim 14, wherein the control device is configured to determine whether one of the low-voltage-side detection value or the intermediate detection value falls out of a range defined by a undervoltage threshold value and an overvoltage threshold value when the control device determines in the third determination processing step that the main body circuitry is not abnormal, and perform the fourth determination processing step when one of the low-voltage-side detection value or the intermediate detection value falls out of the range.

* * * * *